United States Patent
Yamamoto et al.

(10) Patent No.: US 11,605,768 B2
(45) Date of Patent: Mar. 14, 2023

(54) LIGHT-EMITTING DEVICE

(71) Applicant: NICHIA CORPORATION, Anan (JP)

(72) Inventors: Atsushi Yamamoto, Komatsushima (JP); Takeshi Tamura, Tokushima (JP); Shinya Kondo, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 17/545,556

(22) Filed: Dec. 8, 2021

(65) Prior Publication Data
US 2022/0102606 A1 Mar. 31, 2022

Related U.S. Application Data

(63) Continuation of application No. 16/830,503, filed on Mar. 26, 2020, now Pat. No. 11,227,985.

(30) Foreign Application Priority Data

Mar. 28, 2019 (JP) .............................. JP2019-062610
Sep. 30, 2019 (JP) .............................. JP2019-180584

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 33/58* (2013.01); *H01L 33/60* (2013.01)

(58) Field of Classification Search
CPC ..... H01L 25/0753; H01L 33/58; H01L 33/60; H01L 33/62
See application file for complete search history.

(56) References Cited

U.S. PATENT DOCUMENTS

2007/0085944 A1 4/2007 Tanaka et al.
2007/0138497 A1* 6/2007 Loh ................. H01L 33/641
257/E33.059
(Continued)

FOREIGN PATENT DOCUMENTS

JP 2002-270905 A 9/2002
JP 2003-115611 A 4/2003
(Continued)

OTHER PUBLICATIONS

US Office Action issued in U.S. Appl. No. 16/830,503 dated Apr. 27, 2021.
(Continued)

*Primary Examiner* — Feifei Yeung Lopez
(74) *Attorney, Agent, or Firm* — Foley & Lardner LLP

(57) ABSTRACT

A light-emitting device includes: a light-emitting element having an upper surface, and including a plurality of semiconductor light-emitting structures; and a substrate supporting the light-emitting element. The semiconductor light-emitting structures include a first semiconductor light-emitting structure and a second semiconductor light-emitting structure. The substrate includes: an interconnection layer including: a first interconnection portion comprising a first land, a second interconnection portion comprising a second land and a third land, and a third interconnection portion comprising a fourth land, and a first reflective member covering a portion of the interconnection layer and having an opening. The light-emitting element is located inside the opening of the first reflective member as viewed from above. A portion of the first land, a portion of
(Continued)

the second land, a portion of the third land, and a portion of the fourth land are exposed in the opening of the first reflective member.

20 Claims, 12 Drawing Sheets

(51) Int. Cl.
    *H01L 33/60*     (2010.01)
    *H01L 33/58*     (2010.01)

(56) References Cited

U.S. PATENT DOCUMENTS

| | | |
|---|---|---|
| 2009/0267085 A1 | 10/2009 | Lee et al. |
| 2011/0248623 A1 | 10/2011 | Ichikawa |
| 2012/0049224 A1 | 3/2012 | Mizutani et al. |
| 2013/0062649 A1 | 3/2013 | Hata et al. |
| 2014/0140079 A1 | 5/2014 | Marutani |
| 2017/0179345 A1 | 6/2017 | Yamada et al. |
| 2018/0053886 A1 | 2/2018 | Goto et al. |
| 2018/0294391 A1 | 10/2018 | Emura |
| 2018/0342490 A1 | 11/2018 | Biwa |

FOREIGN PATENT DOCUMENTS

| | | |
|---|---|---|
| JP | 2007-140453 A | 6/2007 |
| JP | 2011-134829 A | 7/2011 |
| JP | 2011-181576 A | 9/2011 |
| JP | 2012-074665 A | 4/2012 |
| JP | 2013-109905 A | 6/2013 |
| JP | 2014-103148 A | 6/2014 |
| JP | 2017-073411 A | 4/2017 |
| JP | 2017-092021 A | 5/2017 |
| JP | 2017-117858 A | 6/2017 |
| JP | 2018-032845 A | 3/2018 |
| JP | 2018-085495 A | 5/2018 |
| JP | 2018-181942 A | 11/2018 |

OTHER PUBLICATIONS

US Notice of Allowance issued in U.S. Appl. No. 16/830,503 dated Sep. 9, 2021.

* cited by examiner

LIGHT-EMITTING DEVICE

CROSS-REFERENCE TO RELATED APPLICATIONS

This application is continuation of U.S. patent application Ser. No. 16/830,503, filed on Mar. 26, 2020, which claims priority to Japanese Patent Application No. 2019-062610, filed on Mar. 28, 2019, and Japanese Patent Application No. 2019-180584, filed on Sep. 30, 2019, the disclosures of which are hereby incorporated by reference in their entireties.

BACKGROUND

The present disclosure relates to light-emitting devices.

Japanese Patent Publication No. 2002-270905 discloses a composite light-emitting element in which a block light-emitting element including a plurality of light-emitting elements formed by depositing a GaN compound semiconductor on a common sapphire substrate is mounted on a submount element. As can be understood from the description of Japanese Patent Publication No. 2002-270905 (e.g., paragraphs [0004] and [0005]), it is generally advantageous to form a plurality of light-emitting structures of a GaN compound semiconductor, each of which includes an active layer, on a common sapphire substrate, in terms of obtaining a larger luminous flux, compared to the configuration in which a single light-emitting structure is formed on a sapphire substrate.

The submount element disclosed in Japanese Patent Publication No. 2002-270905 is formed of a silicon substrate, and has an n-electrode pattern and a p-electrode on an upper surface thereof. Each of the plurality of light-emitting elements in the block light-emitting element is mounted on the submount element by electrodes provided on the opposite side from the sapphire substrate being bonded by bumps to the electrode patterns on the submount element.

SUMMARY

In an element having a plurality of semiconductor light-emitting structures electrically independent of each other, like the block light-emitting element disclosed in Japanese Patent Publication No. 2002-270905, it is advantageous to verify the presence or absence of leakage current in each of the plurality of semiconductor light-emitting structures individually after the plurality of semiconductor light-emitting structures are mounted on a support (e.g., a submount element) having an electrode pattern.

A light-emitting device according to an embodiment of the present disclosure includes: a light-emitting element having an upper surface, and including a plurality of semiconductor light-emitting structures each having a first and a second electrode having different polarities, disposed on the opposite side from the upper surface of the light-emitting element, and electrically separated from each other; and a substrate supporting the light-emitting element. The plurality of semiconductor light-emitting structures include a first and a second semiconductor light-emitting structure. The substrate has an interconnection layer having a land pattern including a first interconnection portion on which a first land is provided, a second interconnection portion on which a second and a third land are provided, and a third interconnection portion on which a fourth land is provided, and a first reflective member covering a portion of the interconnection layer and having an opening. The light-emitting element is located inside the opening of the first reflective member as viewed from above. A portion of the first land of the first interconnection portion is exposed in the opening of the first reflective member, and is coupled to the first electrode of the first semiconductor light-emitting structure. A portion of the second land and a portion of the third land, of the second interconnection portion, are exposed inside the opening of the first reflective member, and are coupled to the second electrode of the first semiconductor light-emitting structure and the first electrode of the second semiconductor light-emitting structure, respectively. A portion of the fourth land of the third interconnection portion is exposed inside the opening of the first reflective member, and is coupled to the second electrode of the second semiconductor light-emitting structure.

According to certain embodiments of the present disclosure, provided is a light-emitting device in which each of a plurality of semiconductor light-emitting structures included in a light-emitting element can be easily inspected even after the light-emitting element is mounted on a support having an electrode pattern.

DETAILED DESCRIPTION

Figure 1:
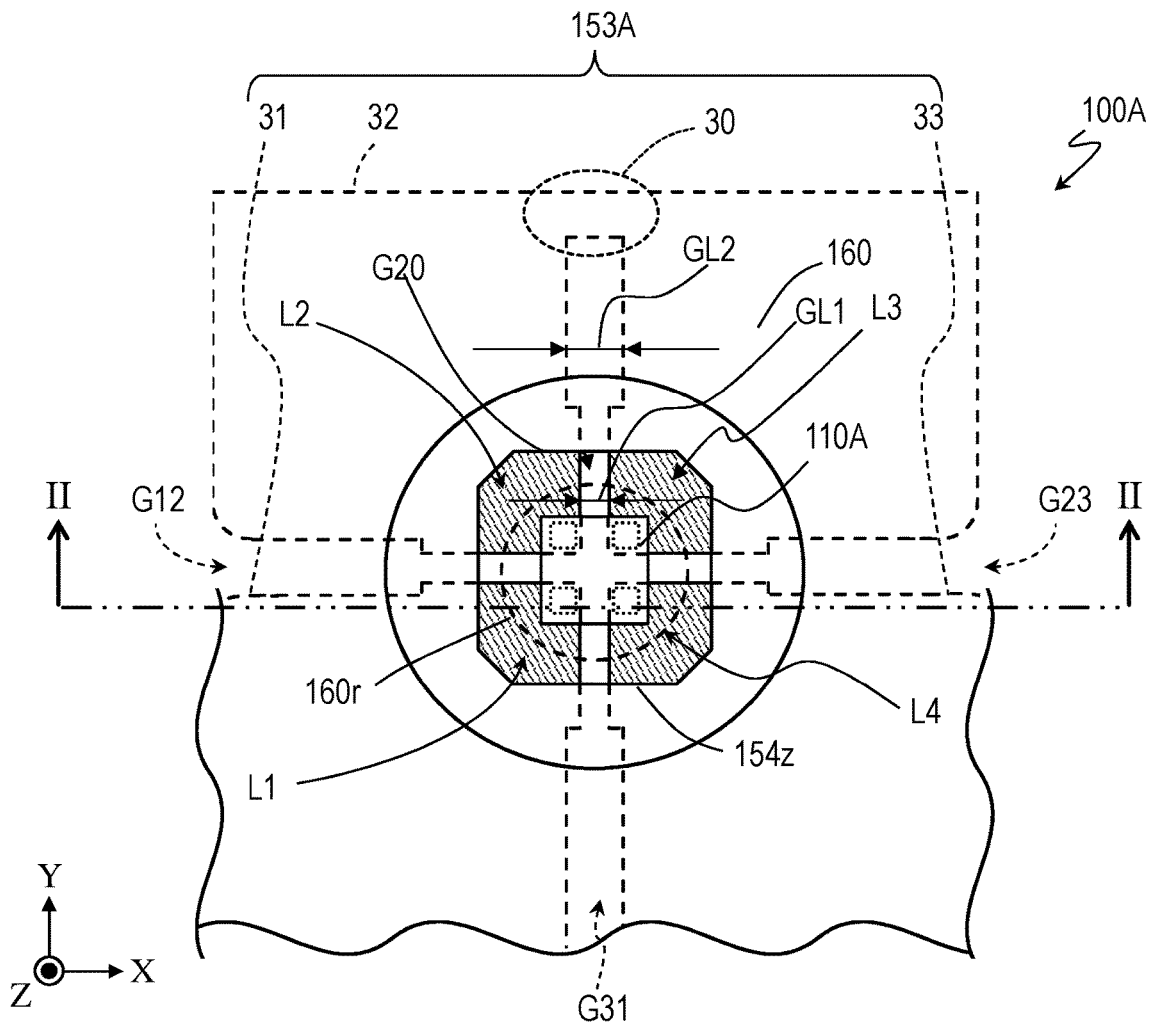
FIG. 1 is a schematic enlarged top view showing a light-emitting element and surroundings of a light-emitting device according to an embodiment of the present disclosure.

Embodiments of the present disclosure will be described in detail with reference to the accompanying drawings. The following embodiments are illustrative, and a light-emitting device according to the present invention is not limited thereto. For example, the numerical values, shapes, materials, steps, and the order of the steps, etc., indicated in the following embodiments are merely illustrative, and various modifications can be made thereto unless a technical contradiction occurs.

The dimensions, shapes, etc., of elements shown in the drawings may be exaggerated for clarity. The dimensions, shapes, etc., of the elements of an actual light-emitting device are not necessarily drawn to scale, e.g., the dimensions of some of the elements of the light-emitting module relative to the other elements may be exaggerated. Some of the elements may not be shown, in order to avoid unnecessarily obfuscating the drawings.

In the description that follows, like elements may be denoted by like reference numerals and redundant descriptions may be omitted. Terms indicating specific directions and positions (e.g., "upper," "lower," "right," "left," and other terms including such terms) may be hereinafter used. Note however that these terms are only used for clarity of illustration to refer to relative directions and positions in the drawings to which reference is made. When applied to drawings, actual products, actual manufacturing apparatuses, etc., other than those of the present disclosure, the elements may not have the same arrangement as that shown in the drawings to which reference is made, as long as the elements have the same directions and positions relative to each other that are indicated by the terms such as "upper" and "lower" in the drawings to which reference is made. As used herein, the term "parallel" with respect to two straight lines, sides, planes, etc., is intended to encompass some deviations from absolute parallelism (0°) that are in the range of about ±5°, unless otherwise specified. As used herein, the terms "perpendicular" and "orthogonal" with respect to two straight lines, sides, planes, etc., are intended to encompass some deviations from absolute perpendicularity and orthogonality (90°) that are in the range of about ±5°, unless otherwise specified.

Figure 2:
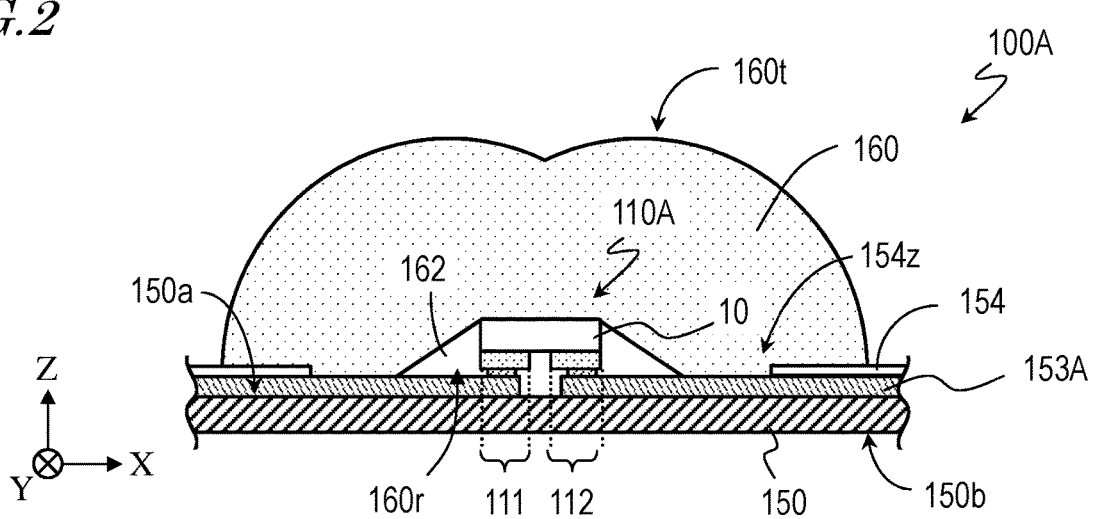
FIG. 2 is a schematic cross-sectional view of the light-emitting device of the embodiment of the present disclosure.

FIGS. 1 and 2 schematically show a light-emitting device according to an embodiment of the present disclosure. For reference, in FIGS. 1 and 2, the X direction, the Y direction, and the Z direction, which are orthogonal to each other, are indicated by arrows. In the other drawings of the present disclosure, these arrows may be shown. FIG. 1 schematically shows an appearance of the light-emitting device of the embodiment of the present disclosure as viewed from above. FIG. schematically shows a cross-section of the light-emitting device of FIG. 1 taken parallel to the ZX plane of the figure. The cross-section of FIG. 2 corresponds to the II-II cross-section of FIG. 1.

The light-emitting device 100A of FIGS. 1 and 2 mainly has a light-emitting element 110A and a substrate 150 supporting the light-emitting element 110A. As shown in FIG. 2, the substrate 150 has an upper surface 150a and a lower surface 150b located on the opposite side from the upper surface 150a, and has an interconnection layer 153A on the upper surface 150a. The substrate 150 further has a first reflective member 154 covering a portion of the interconnection layer 153A. Here, the first reflective member 154 has generally a layer-shaped structure, and has an opening 154z in a portion thereof. A portion of the interconnection layer 153A of the substrate 150 is exposed inside the opening 154z of the first reflective member 154.

As shown in FIG. 1, the light-emitting element 110A is disposed inside the opening 154z of the first reflective member 154 as viewed from above, and is thus mounted on the substrate 150. The light-emitting element 110A is electrically coupled to the interconnection layer 153A of the substrate 150 through a bonding member such as solder. Note that in this example, the entire light-emitting element 110A is disposed in a recess 160r of a light-transmissive member 160, and is thereby covered by the light-transmissive member 160.

In the configuration illustrated in FIG. 1, the interconnection layer 153A has a land pattern including a first interconnection portion 31, a second interconnection portion 32, and a third interconnection portion 33. The first interconnection portion 31 has a first land L1 as a portion thereof. As used herein, the term "land" refers to an island-shaped structure having a larger area than that of a linear interconnect of an interconnection layer. The second interconnection portion 32 of the interconnection layer 153A has a second land L2, a third land L3, and a connection portion 30. The third interconnection portion 33 has a fourth land L4. As schematically shown in FIG. 1, the first land L1, the second land L2, the third land L3, and the fourth land L4 are each partially exposed in the opening 154z of the first reflective member 154. As described below, an electrode of the light-emitting element 110A is coupled to the first land L1, the second land L2, the third land L3, and the fourth land L4.

As schematically shown in FIG. 1, a gap G12 is provided between the first interconnection portion 31 and the second interconnection portion 32. The first land L1 of the first interconnection portion 31 and the second land L2 of the second interconnection portion 32 are separated from each other in space by the gap G12 and are thereby electrically separated from each other. Likewise, a gap G23 is provided between the second interconnection portion 32 and the third interconnection portion 33, which are thereby electrically separated from each other. A gap G31 is provided between the third interconnection portion 33 and the first interconnection portion 31, which are thereby electrically separated from each other. A portion of the gap G12, a portion of the gap G23, and a portion of the gap G31 are also extended inside the opening 154z of the first reflective member 154.

As shown in FIG. 1, a slit-shaped gap G20 is also provided in the second interconnection portion 32. By the formation of the gap G20, portions of the second land L2 and the third land L3 of the second interconnection portion 32 that are exposed from the opening 154z of the first reflective member 154 are separated from each other in space. Note that the second land L2 and the third land L3 are electrically coupled to each other through the connection portion 30 of the second interconnection portion 32, and therefore, have equal potentials.

As shown in FIG. 1, the widths of the gaps G12, G20, G23, and G31 between two adjacent ones of the first land L1, the second land L2, the third land L3, and the fourth land L4 of the interconnection layer 153A, i.e., the distance between two adjacent lands, may be greater on a side further from the light-emitting element 110A than on a side closer to the light-emitting element 110A. Specifically, a distance GL2 between two adjacent lands in a region covered by the first reflective member 154 is greater than a distance GL1 between two adjacent lands in the opening 154z of the first reflective member 154. In the embodiment of FIG. 1, in the opening 154z of the first reflective member 154, the distance GL1 between two adjacent land is uniform irrespective of the distance from the light-emitting element 110A. In the opening 154z of the first reflective member 154, a region between two adjacent lands, i.e., the gaps G12, G20, G23, and G31, is not covered by the first reflective member 154, and therefore, the upper surface 150a of the substrate 150 is exposed in the gaps G12, G20, G23, and G31.

In the embodiment of the present disclosure, a light-emitting element in a light-emitting device has a plurality of semiconductor light-emitting structures that are electrically independent of each other. For example, the light-emitting element 110A of FIG. 2 includes a first semiconductor light-emitting structure 111 and a second semiconductor light-emitting structure 112 that are formed on a common light-transmissive substrate 10. As described in detail below with reference to the drawings, the first and second semiconductor light-emitting structures, each of which has an active layer interposed between an n-type semiconductor layer and a p-type semiconductor layer, emit light when supplied with a predetermined current. For the sake of simplicity, the first semiconductor light-emitting structure 111 and the second semiconductor light-emitting structure 112 are hereinafter referred to as a "first light-emitting cell 111" and a "second light-emitting cell 112," respectively.

Each of the first light-emitting cell 111 and the second light-emitting cell 112 has a positive and a negative electrode on a side of the substrate 150 opposite the interconnection layer 153A. As described in detail below with reference to the drawings, the first light-emitting cell 111 has a first electrode (e.g., an n-electrode) and a second electrode (e.g., a p-electrode) that have different polarities. The second light-emitting cell 112 also has a first electrode (e.g., an n-electrode) and a second electrode (e.g., a p-electrode) that have different polarities. The first and second electrodes of the first light-emitting cell 111 are electrically coupled to the first land L1 and the second land L2, respectively, of the interconnection layer 153A. The first and second electrodes of the second light-emitting cell 112 are electrically coupled to the third land L3 and the fourth land L4, respectively, of the interconnection layer 153A.

Here, the second land L2 and the third land L3 are a portion of the second interconnection portion 32. Therefore, because the second electrode of the first light-emitting cell 111 is coupled to the second land L2, and the first electrode of the second light-emitting cell 112 is coupled to the third land L3, the first light-emitting cell 111 and the second light-emitting cell 112 are electrically coupled together in series (or in parallel) through the interconnection layer 153A.

In the configuration in which a plurality of light-emitting cells capable of independently emitting light using a supplied current are disposed in a single light-emitting element like the light-emitting element 110A of FIG. 2, it is advantageous to inspect each light-emitting cell for a defect, such as leakage current, by measuring a voltage drop or the like. However, in the case in which a light-emitting element includes a plurality of light-emitting cells capable of operating independently, once the light-emitting element has been mounted on a substrate, the plurality of light-emitting cells in the light-emitting element are electrically coupled together through an interconnection layer of the substrate. Therefore, for example, in the case in which the plurality of light-emitting cells are electrically coupled together in series through the interconnection layer of the substrate, an overall voltage drop of the plurality of light-emitting cells can be measured, but a voltage drop in each individual light-emitting cell cannot be measured. Specifically, for example, in the case in which an attempt is made to detect a leakage by applying a reverse bias, then even if there is a leakage in one of the plurality of light-emitting cells, a current may be blocked by the other light-emitting cells, so that the leakage cannot be detected. In addition, a standard for a measured value is typically set, taking into account the precision of measurement and an individual difference (variations in electrical characteristics) of a light-emitting cell, and therefore, the measurement of an overall voltage drop in the plurality of light-emitting cells is unlikely to allow identification of a light-emitting cell having a minute leakage and detection of a defect in the light-emitting cell.

In contrast, in the embodiment of the present disclosure, for example, the first electrode of the first light-emitting cell 111, the second electrode of the first light-emitting cell 111, the first electrode of the second light-emitting cell 112, and the second electrode of the second light-emitting cell 112 are coupled to the first land L1, the second land L2, the third land L3, and the fourth land L4, respectively, provided on the interconnection layer 153A of the substrate 150. Here, the second land L2 and the third land L3 are a part of the common second interconnection portion. Therefore, the first light-emitting cell 111 and the second light-emitting cell 112 can, for example, be electrically coupled together in series through the interconnection layer 153A. In such a structure, for example, by measuring a voltage drop between the first land L1 and the second land L2 of the interconnection layer 153A, the presence or absence of a leakage current in the first light-emitting cell 111 can be investigated. In addition, for example, by measuring a voltage drop between the third land L3 (or the second land L2) and the fourth land L4 of the interconnection layer 153A, the presence or absence of a leakage current in the second light-emitting cell 112 can be investigated. Thus, in the state in which the first light-emitting cell 111 and the second light-emitting cell 112 are electrically coupled together through the interconnection layer 153A, the presence or absence of a leakage current in the first light-emitting cell 111, and the presence or absence of a leakage current in the second light-emitting cell 112, can be verified individually.

Specifically, in the embodiment of the present disclosure, a voltage drop, etc., can be relatively easily measured for each of the first light-emitting cell 111 and the second light-emitting cell 112 in the state that these cells are coupled together in series, for example. Therefore, the occurrence of a defect such as leakage current can be detected for each of a plurality of light-emitting cells electrically coupled together through an interconnection layer of a substrate. To allow inspection of individual light-emitting cells for electrical characteristics contributes to an improvement in the yield and reliability of a light-emitting device.

Each element of the light-emitting device 100A will now be described in detail with reference to the drawings.

[Light-Emitting Element 110A]

Figure 3:
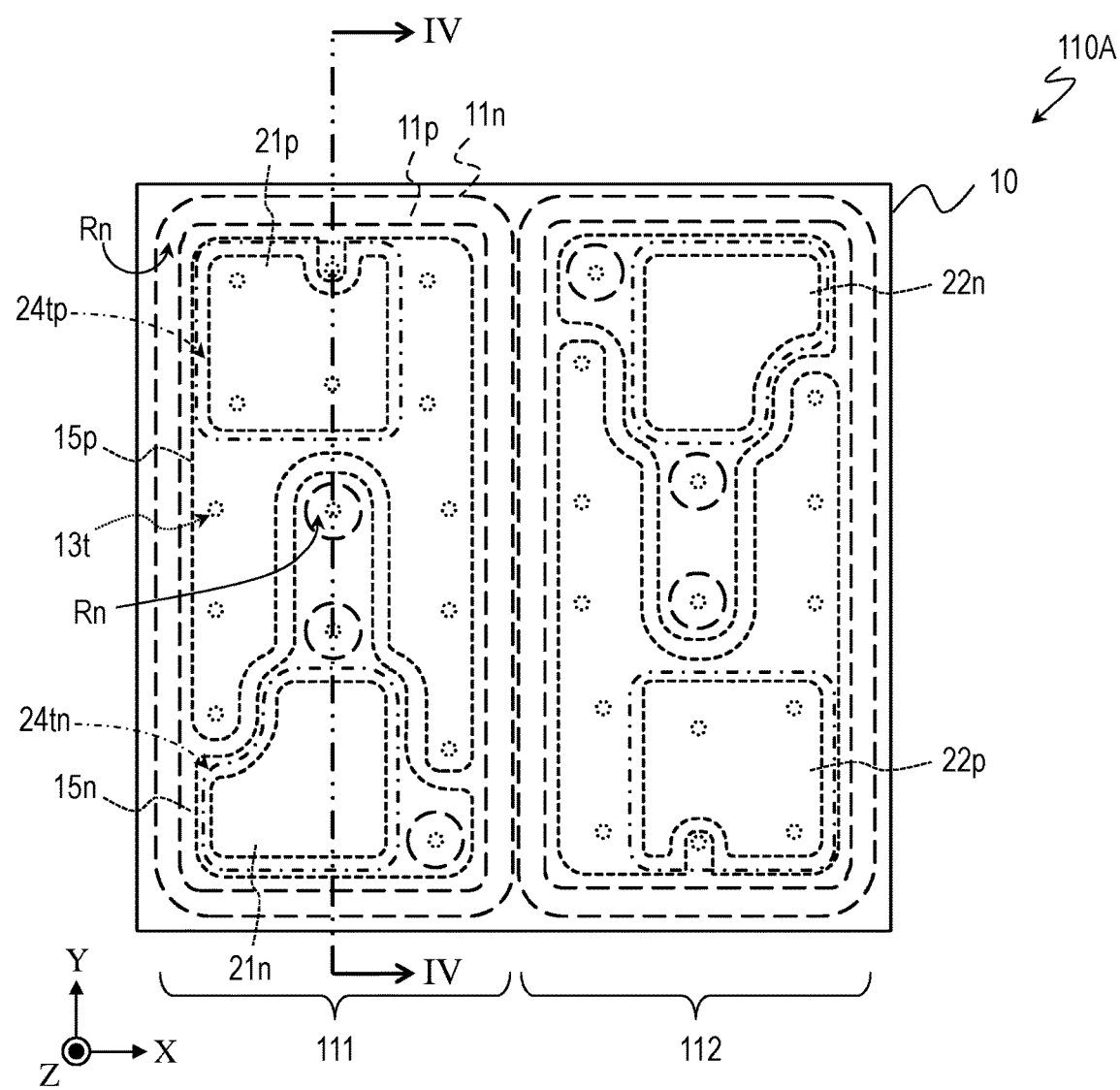
FIG. 3 is a schematic top perspective view of the light-emitting element of FIGS. 1 and 2.
Figure 4:
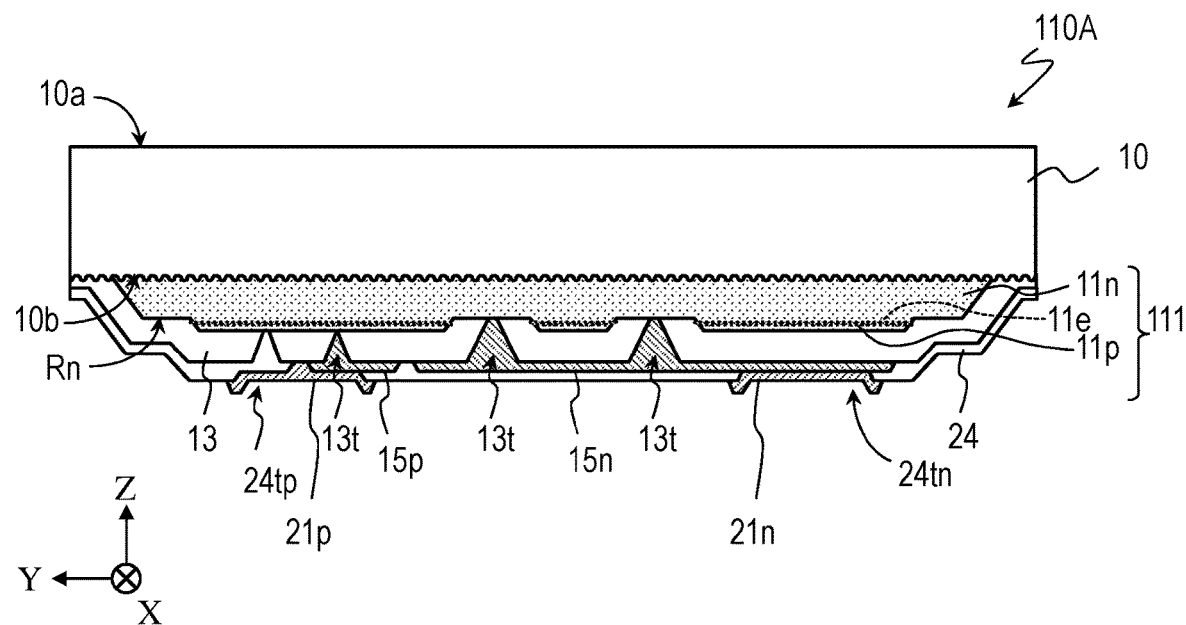
FIG. 4 is a schematic cross-sectional view of the light-emitting element of FIG. 3 taken parallel to the YZ plane of FIG. 3.

FIG. 3 shows the light-emitting element 110A of FIGS. 1 and 2. FIG. 4 schematically shows a cross-section of the light-emitting element 110A taken parallel to the YZ plane of the figure. The cross-section of FIG. 4 corresponds to a IV-IV cross-section of FIG. 3.

Each of the light-emitting elements in the light-emitting device of the embodiment of the present disclosure has a plurality of semiconductor light-emitting structures electrically independent of each other. In the configuration illustrated in FIG. 3, the light-emitting element 110A includes the light-transmissive substrate 10, the first light-emitting cell 111 (first semiconductor light-emitting structure 111), and the second light-emitting cell 112 (second semiconductor light-emitting structure 112). The light-transmissive substrate 10 has an upper surface 10a forming an upper surface of the light-emitting element 110A, and a lower surface 10b located on the opposite side from the upper surface 10a. As schematically shown in FIG. 4, the first light-emitting cell 111 is formed on the lower surface 10b of the light-transmissive substrate 10. Likewise, the second light-emitting cell 112 is also located on the lower surface 10b of the light-transmissive substrate 10. As can be seen from FIG. 3, the first light-emitting cell 111 and the second light-emitting cell 112 are separated from each other in space on the lower surface 10b of the light-transmissive substrate 10, and therefore, are electrically independent of each other.

Each of the first light-emitting cell 111 and the second light-emitting cell 112 may have a structure similar to that of a known semiconductor light-emitting element such as a light-emitting diode (LED). Here, the first light-emitting cell 111 and the second light-emitting cell 112 each partially include a structure in which an n-type semiconductor layer, an active layer, and a p-type semiconductor layer are stacked in this order with the n-type semiconductor layer closest to the light-transmissive substrate 10. Here, in a typical embodiment of the present disclosure, the plurality of semiconductor light-emitting structures on the light-transmissive substrate 10 have a common basic configuration. Therefore, in the description that follows, of the first light-emitting cell 111 and the second light-emitting cell 112, attention is paid to the first light-emitting cell 111, and a configuration thereof will be described in detail, and the configuration of the second light-emitting cell 112 will not be described in detail.

The first light-emitting cell 111 has an n-type semiconductor layer 11n on the lower surface 10b of the light-transmissive substrate 10, and an active layer 11e and a p-type semiconductor layer 11p formed on a partial region of the n-type semiconductor layer 11n. In other words, the n-type semiconductor layer 11n of the first light-emitting cell 111 has a region Rn that is a portion of the upper surface thereof and is not covered by either of the active layer 11e and the p-type semiconductor layer 11p. As described above, the first light-emitting cell 111 and the second light-emitting cell 112 are disposed apart from each other on the light-transmissive substrate 10, and are thereby electrically separated from each other. Thus, in the light-emitting element 110A, the first light-emitting cell 111 and the second light-emitting cell 112 are light-emitting structures electrically independent of each other. For example, a gap having a width of about 5 μm, in which the lower surface 10b of the light-transmissive substrate 10 is exposed, is formed between the first light-emitting cell 111 and the second light-emitting cell 112.

The active layer of the first light-emitting cell 111 and the active layer of the second light-emitting cell 112 emit light having a peak wavelength in the range of, for example, 360-650 nm. These light-emitting cells may include a nitride semiconductor ($In_xAl_yGa_{1-x-y}N$, $0 \leq x$, $0 \leq y$, and $x+y \leq 1$) capable of emitting light having a wavelength in the range from ultraviolet to visible. Note that if the active layers of the plurality of light-emitting cells (here, the first light-emitting cell 111 and the second light-emitting cell 112) have a common shape and area as viewed from above, an extreme luminance difference is unlikely to occur between each light-emitting cell, which is advantageous to prevention or reduction of luminance non-uniformity.

The light-transmissive substrate 10 supports the first light-emitting cell 111 and the second light-emitting cell 112. The light-transmissive substrate 10 may be an insulating substrate, typified by a sapphire substrate and a gallium nitride substrate, for epitaxially growing a semiconductor layer in the formation of the semiconductor multilayer structure of the first light-emitting cell 111 and the second light-emitting cell 112. As used in, the terms "light transmission" and "light-transmissive" are intended to encompass the ability to diffuse incident light, and are not limited to "transparent." As schematically shown in FIG. 4, by providing a minute roughness pattern on the lower surface 10b of the light-transmissive substrate 10, the efficiency of extraction of light from the light-emitting cell can be improved. The roughness pattern is formed of, for example, a plurality of minute protrusions. The protrusions forming the roughness pattern may have a height of, for example, about 5 nm or more.

The shape of the light-transmissive substrate 10 as viewed from above is typically rectangular, such as square. The sides of the rectangular shape of the light-transmissive substrate 10 have a length in the range of, for example, about 300 μm to about 3 mm, preferably in the range of 500 μm to 1.5 mm. In FIGS. 1 and 3, the sides of the rectangular shape of the light-transmissive substrate 10 are parallel to the X direction or the Y direction of the figures.

The light-emitting cells of the light-transmissive substrate 10 each further include one or more insulating layers and electrodes. For example, as shown in FIG. 4, the first light-emitting cell 111 further has a first insulating film 13 covering the multilayer structure of the n-type semiconductor layer 11n, the active layer 11e, and the p-type semiconductor layer 11p, an n-internal electrode 15n and a p-internal electrode 15p located on the first insulating film 13, a second insulating film 24 covering the n-internal electrode 15n and the p-internal electrode 15p, and an n-external electrode 21n and a p-external electrode 21p located on the second insulating film 24.

The first insulating film 13, which is formed of an oxide or nitride containing one or more selected from the group consisting of 1 Si, Ti, Zr, Nb, Ta, Al, and Hf, continuously covers the first light-emitting cell 111 and the second light-emitting cell 112. In particular, $SiO_2$, which provides a high transmittance and a low refractive index for visible light, is suitable as a material for the first insulating film 13. For example, a multilayer film in which $SiO_2$ and $Nb_2O_5$ are alternately stacked can be suitably used as the first insulating film 13.

A plurality of first through holes 13t are provided in the first insulating film 13. The n-internal electrode 15n and the p-internal electrode 15p described below are electrically coupled to the n-type semiconductor layer 11n and the p-type semiconductor layer 11p, respectively, through the first through holes 13t. Here, 15 first through holes 13t are formed in a portion of the first insulating film 13 that coincides with or covers the first light-emitting cell 111. First through holes 13t may be disposed on the region Rn of the n-type semiconductor layer 11n of the first light-emitting cell 111. Of course, the number, arrangement, and shapes of the first through holes 13t are not limited to the example of FIG. 3 and may be suitably modified.

The n-internal electrode 15n and the p-internal electrode 15p are located on the first insulating film 13, and are electrically coupled to the n-type semiconductor layer 11n and the p-type semiconductor layer 11p, respectively. The n-internal electrode 15n and the p-internal electrode 15p are formed of a metal or alloy that has high light reflectivity and electrical conductivity, such as Al, Ag, an Al alloy, or a Ag alloy. Of these materials, Al and Al alloys, which have high light reflectivity and is less likely to cause migration compared to Ag, are a material suitable for the n-internal electrode 15n and the p-internal electrode 15p. The n-internal electrode 15n and the p-internal electrode 15p may be formed of a multilayer film obtained by depositing Ti, Rh, and Ti in this order.

Note that a light reflective electrode may be provided on the p-type semiconductor layer 11p. In that case, the p-internal electrode 15p is electrically coupled to the p-type semiconductor layer 11p through the light reflective electrode provided on the p-type semiconductor layer 11p. The light reflective electrode may have a shape that covers substantially entirely the upper surface of the p-type semiconductor layer 11p. The light reflective electrode may be made of a material similar to that for the n-internal electrode 15n and the p-internal electrode 15p. By interposing the light reflective electrode between the p-type semiconductor layer 11p and the p-internal electrode 15p, a current can be caused to flow in a wider region of the p-type semiconductor layer 11p. In addition, light traveling toward the opposite side from the light-transmissive substrate 10 can be reflected by the light reflective electrode, so that the efficiency of light extraction can be expected to be improved. It is advantageous to cover the light reflective electrode with a SiN layer or $SiO_2$ layer, because these layers can serve as a barrier layer that prevents or reduces migration of a material of the light reflective electrode.

In the case in which the light reflective electrode is disposed on the p-type semiconductor layer 11p, one or more through holes are also provided in the light reflective electrode. The through hole(s) of the light reflective electrode are located at a position(s) coinciding with one or more of the first through holes 13t of the first insulating film 13 that are provided on the region Rn of the n-type semiconductor layer 11n. The n-internal electrode 15n is electrically coupled to the n-type semiconductor layer 11n through the through holes of the light reflective electrode, and one or more of the first through holes 13t of the first insulating film 13 that are provided on the region Rn of the n-type semiconductor layer 11n.

The second insulating film 24 continuously covers the first insulating film 13, the n-internal electrode 15n, and the p-internal electrode 15p. The second insulating film 24 has a second through hole 24tn at a position coinciding with the n-internal electrode 15n. The n-external electrode 21n described below is electrically coupled to the n-internal electrode 15n through the second through hole 24tn. The second insulating film 24 also has a third through hole 24tp at a position coinciding with the p-internal electrode 15p. The p-external electrode 21p described below is electrically coupled to the p-internal electrode 15p through the third through hole 24tp. In this example, each of the first light-emitting cell 111 and the second light-emitting cell 112 has a single second through hole 24tn and a single third through hole 24tp. Of course, the numbers, arrangements, and shapes of second through holes 24tn and third through holes 24tp are not limited to those of the example of FIG. 3 and may be suitably modified.

The second insulating film 24 may be formed of the same material as that for the first insulating film 13, such as $SiO_2$. The materials for the second insulating film 24 and the first insulating film 13 may be the same or different. If a material having a refractive index lower than those of a material for the light-emitting cell and a material for the light-transmissive substrate 10 and having a large refractive index difference from those of these materials, is used as a material for the second insulating film 24 and/or the first insulating film 13, leakage of light from the opposite side from the light-transmissive substrate 10 is prevented or reduced, so that the effect of improving the efficiency of light extraction can be expected.

As schematically shown in FIG. 4, the n-external electrode 21n is located on the second insulating film 24, and is electrically coupled to the n-internal electrode 15n through the second through hole 24tn of the second insulating film 24. Likewise, the p-external electrode 21p is located on the second insulating film 24, and is electrically coupled to the p-internal electrode 15p through the third through hole 24tp of the second insulating film 24. Thus, the n-external electrode 21n is electrically coupled to the n-type semiconductor layer 11n of the first light-emitting cell 111, and the p-external electrode 21p is electrically coupled to the p-type semiconductor layer 11p of the first light-emitting cell 111. Thus, the n-external electrode 21n and the p-external electrode 21p serve as a pad electrode for supplying a predetermined current to the semiconductor layer in the first light-emitting cell 111.

As shown in FIG. 3, the second light-emitting cell 112 also has, on the opposite side from the upper surface of the light-emitting element 110A, i.e., the upper surface 10a of the light-transmissive substrate 10, an n-external electrode 22n electrically coupled to the n-type semiconductor layer of the second light-emitting cell 112, and a p-external electrode 22p electrically coupled to the p-type semiconductor layer of the second light-emitting cell 112. Thus, the light-emitting element 110A has the first light-emitting cell 111 and the second light-emitting cell 112, which are configured to be able to be driven independently of each other when coupled to a power supply, etc.

The n-external electrode 21n and the p-external electrode 21p of the first light-emitting cell 111, and the n-external electrode 22n and the p-external electrode 22p of the second light-emitting cell 112, may be formed of, for example, plating, and may have a multilayer structure of two or more layers including a first layer as a seed layer and a second layer on the first layer. As a material for the first layer, a metal or alloy that has high light reflectivity and electrical conductivity, such as Al, Ag, an Al alloy, or a Ag alloy, can be used. Examples of a typical material for the second layer include Cu, Au, and Ni. As the n-external electrode 21n, the p-external electrode 21p, the n-external electrode 22n, and the p-external electrode 22p, a multilayer film may be used in which Ti, Ni, and Al are deposited in this order with the Ti layer closet to the light-transmissive substrate 10.

The lower surfaces of the first light-emitting cell 111 and the p-external electrode 21p of the n-external electrode 21n, and the lower surfaces of the n-external electrode 22n and the p-external electrode 22p of the second light-emitting cell 112, are located at substantially the same height with respect to the lower surface 10b of the light-transmissive substrate 10. Each of the n-external electrode 21n, the p-external electrode 21p, the n-external electrode 22n, and the p-external electrode 22p may have a dimension of about 150-200 µm as viewed from above. If the uppermost surface layers of these pad electrodes are a Au layer, eutectic bonding is advantageously applicable to bonding of the pad electrodes to the interconnection layer 153A of the substrate 150. The n-external electrode 21n, the p-external electrode 21p, the n-external electrode 22n, and the p-external electrode 22p are disposed and shaped at a position not coinciding with the first through hole 13*t* provided in the first insulating film 13, whereby the occurrence of a crack in the first insulating film 13 or the second insulating film 24 due to thermal stress during eutectic bonding can be prevented or reduced.

Note that, in this example, the second light-emitting cell 112 has a configuration similar to that of a structure obtained by turning the first light-emitting cell 111 around the light-emitting element 110A by 180° as viewed from above. Therefore, in the example of FIG. 3, the p-external electrode 21*p* of the first light-emitting cell 111 and the n-external electrode 22*n* of the second light-emitting cell 112 are arranged horizontally side by side in the drawing sheet of FIG. 3, and the n-external electrode 21*n* of the first light-emitting cell 111 and the p-external electrode 22*p* of the second light-emitting cell 112 are arranged horizontally side by side in the drawing sheet of FIG. 3.

[Substrate 150]

Reference is made back to FIGS. 1 and 2. The substrate 150, which is located on the opposite side from the light-transmissive substrate 10 of the light-emitting element 110A, supports the light-emitting element 110A. The substrate 150, which is formed of an insulating material such as a resin or ceramic, has the interconnection layer 153A, and the first reflective member 154 covering a portion of the interconnection layer 153A, on the upper surface 150*a* closer to the light-emitting element 110A. Examples of a material for the body portion of the substrate 150, excluding the interconnection layer 153A and the first reflective member 154, include resins such as phenolic resins, epoxy resins, polyimide resins, bismaleimide triazine resins (BT resins), polyphthalamides (PPAs), polyethylene terephthalate (PET), and polyethylene naphthalate (PEN), and ceramics such as alumina, mullite, forsterite, glass ceramics, nitride ceramics (e.g., AlN), carbide ceramics (e.g., SiC), and low temperature co-fired ceramics (LTCCs). The body portion of the substrate 150 may be formed of a composite material, which may be obtained by, for example, mixing the above resin with an inorganic filler such as glass fibers, $SiO_2$, $TiO_2$, or $Al_2O_3$.

The interconnection layer 153A, which is located between the body portion of the substrate 150 and the first reflective member 154, has the function of supplying a predetermined current to the light-emitting element 110A of the substrate 150 when coupled to an external drive circuit or the like. The interconnection layer 153A may be a metal layer of Cu, Ni, or the like formed by adhesion caused by plating, sputtering, vapor deposition, or pressing. In the case in which, for example, a ceramic is used as a material for the body portion of the substrate 150, a high-melting-point metal that can be co-fired with the ceramic of the body portion of the substrate 150, such as W or Mo, can be used as a material for the interconnection layer 153A. The interconnection layer 153A may have a multilayer structure. For example, the interconnection layer 153A may have a pattern of the high-melting-point metal formed by the above method, and a layer containing another metal such as Ni, Au, or Ag which is formed by plating, sputtering, vapor deposition, or the like.

As described above, the interconnection layer 153A has the first interconnection portion 31, the second interconnection portion 32, and the third interconnection portion 33. The first interconnection portion 31 has the first land L1. The second interconnection portion 32 has the second land L2 and the third land L3 electrically coupled to each other through the connection portion 30. The third interconnection portion 33 has the fourth land L4. The n-external electrode 21*n* of the first light-emitting cell 111 described above with reference to FIG. 3 is coupled to the first land L1 of the first interconnection portion 31. Meanwhile, the p-external electrode 21*p* of the first light-emitting cell 111 is coupled to the second land L2 of the second interconnection portion 32. The n-external electrode 22*n* and the p-external electrode 22*p* of the second light-emitting cell 112 of FIG. 3 is coupled to the third land L3 of the second interconnection portion 32 and the fourth land L4 of the third interconnection portion 33, respectively. FIG. 1 shows a state in which the light-emitting element 110A is mounted on the substrate 150. A bonding member such as Au—Sn solder or Ag—Sn solder can be used to provide coupling between the n-external electrode 21*n* and the first land L1, between the p-external electrode 21*p* and the second land L2, between the n-external electrode 22*n* and the third land L3, and between the p-external electrode 22*p* and the fourth land L4.

Figure 5:
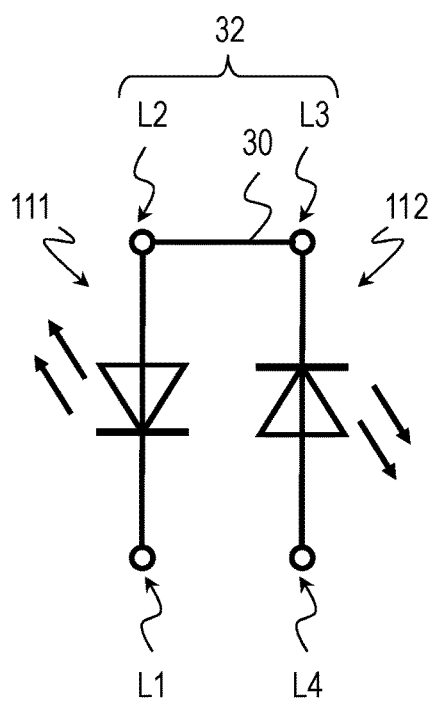
FIG. 5 is a diagram showing an equivalent circuit of the light-emitting device of FIGS. 1 and 2.

FIG. 5 shows an equivalent circuit of the light-emitting device 100A including the light-emitting element 110A mounted on the substrate 150. As shown in FIG. 5, the p-external electrode 21*p* of the first light-emitting cell 111 is coupled to the second land L2 of the second interconnection portion 32, and the n-external electrode 22*n* of the second light-emitting cell 112 is coupled to the third land L3 of the second interconnection portion 32, so that the first light-emitting cell 111 and the second light-emitting cell 112, which are electrically independent of each other in the light-emitting element 110A, are electrically coupled together in series through the second interconnection portion 32 of the interconnection layer 153A.

Here, referring to FIG. 1, each of the first land L1, the second land L2, the third land L3, and the fourth land L4 has a portion exposed in the opening 154*z* of the insulating first reflective member 154. Therefore, by selecting two appropriate ones of these lands and, for example, causing a current to pass through the selected lands, a voltage drop occurring when a reverse voltage is applied (or a forward voltage is applied) can be measured for one of the first light-emitting cell 111 and the second light-emitting cell 112. Thus, the first light-emitting cell 111 and the second light-emitting cell 112 can be inspected for a defect such as leakage current even with the first light-emitting cell 111 and the second light-emitting cell 112 coupled together in series.

Note that the distance between the n-external electrode 21*n* and the p-external electrode 21*p* of the first light-emitting cell 111, and the distance between the n-external electrode 22*n* and the p-external electrode 22*p* of the second light-emitting cell 112, are no greater than about several hundreds of micrometers. On the other hand, in the embodiment of the present disclosure, the light-emitting element 110A has already been mounted on the substrate 150, and therefore, a voltage drop, etc., can be easily measured, because two appropriate ones can be selected from the first land L1, the second land L2, the third land L3, and the fourth land L4 by comparing the areas of the positive and negative electrodes provided in each light-emitting cell, and a measurement probe can be brought into contact with the selected lands. In addition, the first land L1, the second land L2, the third land L3, and the fourth land L4 can have a large region that is exposed in the opening 154*z* of the first reflective member 154 and does not overlap the light-emitting element 110A. Therefore, a measurement probe, etc., can be easily brought into contact with the first land L1, the second land L2, the third land L3, and the fourth land L4, and therefore, it is easier to perform an inspection for a defect such as leakage current.

The first reflective member 154, which is formed of, for example, a resin material in which a light reflective filler is dispersed, has a reflectance of 60% or more with respect to the peak wavelength of light emitted by the light-emitting element 110A. The first reflective member 154 may also have the function of preventing or reducing excessive spread of a bonding member on the interconnection layer 153A, as a solder resist. The first reflective member 154 more advantageously has a reflectance of 70% or more, even more advantageously 80% or more, with respect to the peak wavelength of light emitted by the light-emitting element 110A.

In the example of FIG. 1, most of the interconnection layer 153A is covered by the first reflective member 154. Therefore, a portion of light emitted from the light-emitting element 110A that travels toward the substrate 150 can be efficiently reflected by the first reflective member 154 toward the opposite side from the substrate 150. In this example, the opening 154z of the first reflective member 154 has an octagonal shape symmetrical about the center of the light-emitting element 110A as viewed from above. The portions of the first land L1, the second land L2, the third land L3, and the fourth land L4 of the interconnection layer 153A that are exposed in the opening 154z of the first reflective member 154 has a 4-fold rotational symmetrical arrangement about the center of the light-emitting element 110A.

By arranging the lands of the interconnection layer 153A, which absorbs light more easily than the first reflective member 154, in a rotational symmetry (here, 4-fold rotational symmetry) about the center of the light-emitting element 110A, the anisotropy of light absorption by the interconnection layer 153A can be reduced. Thus, non-uniform light distribution in the XY plane of the figure is prevented or reduced, and thereby, more uniform light distribution can be achieved. In particular, in this example, a slit-shaped gap G20 is also provided between the second land L2 and the third land L3 of the second interconnection portion 32, so that the gap G20 is extended inside the opening 154z of the first reflective member 154. In addition, the connection portion 30 coupling the second land L2 and the third land L3 of the second interconnection portion 32 together is entirely covered by the first reflective member 154. Such a configuration makes it easier to introduce symmetry into the shape and arrangement of a plurality of portions of the interconnection layer 153A that are exposed in the opening 154z of the first reflective member 154. In addition, inside the opening 154z of the first reflective member 154, the gaps G12, G20, G23, and G31 extend in four symmetrical directions, and therefore, the tilt of the light-emitting element 110A that would occur due to the large or small amount of the bonding member can be advantageously easily avoided or reduced. The shape of the opening 154z of the first reflective member 154 is not limited to the octagonal shape of FIG. 1, and may be circular, quadrilateral, etc.

Examples of a base material of a resin material for forming the first reflective member 154 include silicone resins, phenolic resins, epoxy resins, BT resins, and polyphthalamides (PPAs). As the light reflective filler, metal particles, or particles of an inorganic or organic material that has a refractive index higher than that of the base material in which the light reflective filler is dispersed, can be used. Examples of the light reflective filler include particles of titanium dioxide, silicon oxide, zirconium dioxide, potassium titanate, aluminum oxide, aluminum nitride, boron nitride, mullite, niobium oxide, or barium sulfate, or particles of various rare-earth oxides, such as yttrium oxide and gadolinium oxide. The first reflective member 154 advantageously has a white color.

[Light-Transmissive Member 160]

In the configuration illustrated in FIGS. 1 and 2, the light-emitting device 100A has the light-transmissive member 160 covering the entire light-emitting element 110A and a portion of the first reflective member 154. The light-transmissive member 160 protects the light-emitting element 110A from external force, dust, water, etc., and may serve as a lens for adjusting distribution of light emitted by the light-emitting element 110A.

In the example of FIG. 2, the light-transmissive member 160 has a recess in a portion thereof directly above the light-emitting element 110A. Therefore, in this example, a peak portion 160t of the light-transmissive member 160 that is a highest portion (a portion furthest from the upper surface 150a of the substrate 150) is in the shape of a circular ring whose center coincides with the light-emitting element 110A as viewed from above. Such a shape of the light-transmissive member 160 easily prevents or reduces an extreme increase in luminance at a portion directly above the light-emitting element 110A.

The light-transmissive member 160 has the recess 160r on a side thereof closer to the substrate 150. The light-emitting element 110A is disposed in the recess 160r. The recess 160r is in the shape of, for example, a truncated cone in which the bottom portion of the recess (the upper surface of the truncated cone) is smaller than the opening of the recess (the base of the truncated cone). The recess 160r is disposed so that the emission surface of the light-emitting element 110A is opposite the bottom portion of the recess 160r. The shape of the recess 160r is not limited to the truncated cone, and may be a truncated pyramid in which the opening and bottom portion of the recess are quadrilateral. In the example of FIG. 1, the light-transmissive member 160 is supported by the substrate 150.

As a material for the light-transmissive member 160, a resin material containing a transparent resin or the like as a base material can be used. A typical example of the base material for the light-transmissive member 160 is a thermosetting resin, such as an epoxy resin or silicone resin. As the base material for the light-transmissive member 160, a silicone resin, silicone modified resin, epoxy resin, phenolic resin, polycarbonate resin, acrylic resin, polymethyl pentene resin, or polynorbornene resin, or a material containing two or more such materials, may be used. By dispersing a material having a refractive index different from that of the base material in the material of the light-transmissive member 160, a light diffusion function may be imparted to the light-transmissive member 160. For example, particles of titanium dioxide, silicon oxide, or the like may be dispersed in the base material of the light-transmissive member 160. Alternatively, a wavelength conversion function may be imparted by dispersing particles of a fluorescent material in the base material of the light-transmissive member 160.

In the configuration illustrated in FIG. 2, an underfill 162 is disposed between the light-emitting element 110A and the upper surface 150a of the substrate 150. The underfill 162 may be disposed in the recess 160r of the light-transmissive member 160 so as to cover a lateral surface of the light-emitting element 110A. After the light-emitting element 110A is mounted on the substrate 150, the underfill 162 may be formed before the light-transmissive member 160 is formed. Here, the underfill 162 advantageously has a refractive index lower than that of the light-transmissive member 160. If the underfill 162 and the light-transmissive member 160 have such a refractive index relationship, light emitted from the lateral surface of the light-emitting element 110A is refracted by an interface between the underfill 162 and the light-transmissive member 160, so that the light emitted from the lateral surface of the light-emitting element 110A can be extracted in a direction oblique to the normal direction of the substrate 150. In addition, if the light-transmissive member 160 is formed of a material having higher thixotropy that that of the material for the underfill 162, the lateral surface of the light-emitting element 110A can be easily covered by the underfill 162, and the light-transmissive member 160 having a desired external shape can be formed with high precision. As an example of such a material combination, the underfill 162 may be formed of dimethyl silicone, and the light-transmissive member 160 may be formed of phenyl silicone.

(Variations)

Figure 6:
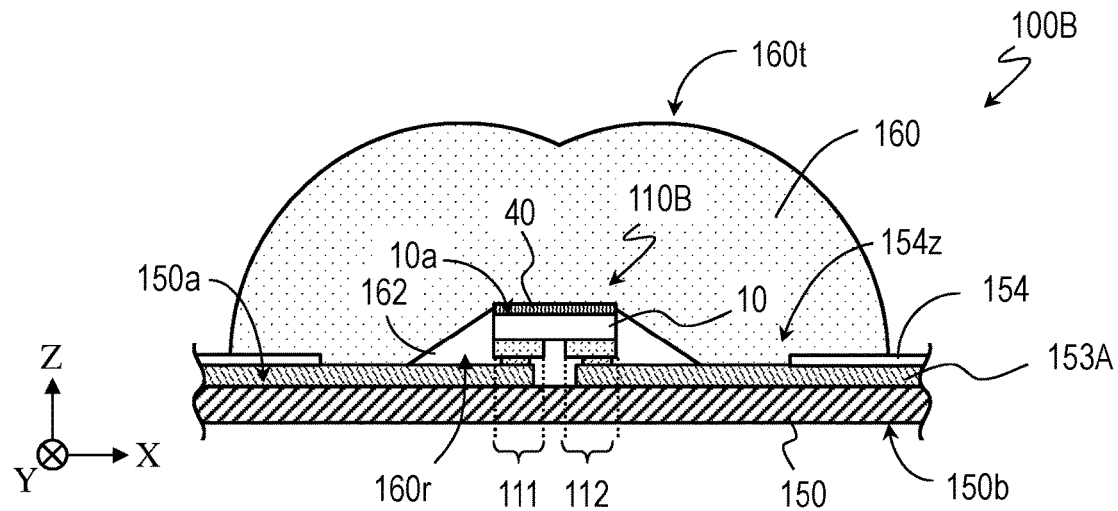
FIG. 6 is a schematic cross-sectional view showing a variation of the light-emitting device of the embodiment of the present disclosure.

FIG. 6 shows a variation of the light-emitting device of the embodiment of the present disclosure. Compared to the light-emitting device 100A of FIG. 2, a light-emitting device 100B shown in FIG. 6 has a light-emitting element 110B instead of the light-emitting element 110A. The light-emitting element 110A and the light-emitting element 110B have a common feature that each of them has the first light-emitting cell 111 and the second light-emitting cell 112.

In the example of FIG. 6, the light-emitting element 110B has a reflective layer 40 on the upper surface 10a of the light-transmissive substrate 10. The reflective layer 40 is, for example, a metal film or dielectric multilayer film. An example material for the dielectric multilayer film is an oxide or nitride containing at least one selected from the group consisting of Si, Ti, Zr, Nb, Ta, Al, and Hf. For example, a multilayer film in which $SiO_2$ and $Nb_2O_5$ are alternately stacked can be used as the reflective layer 40. If the reflective layer 40 is provided on the upper surface of the light-emitting element 110B, the emission of light from the upper surface 10a of the light-transmissive substrate 10 can be prevented or reduced, so that batwing light distribution characteristics can be more easily obtained. As used herein, the term "batwing light distribution characteristics" refers to light distribution characteristics that are defined as an emission intensity distribution in which the emission intensity is higher at light distribution angles whose absolute values are greater than zero, where the optical axis has a light distribution angle of 0°. The disposition of the reflective layer 40 on the upper surface of the light-emitting element 110B contributes to the reduction of the thickness of the light-emitting device 100B.

Figure 7:
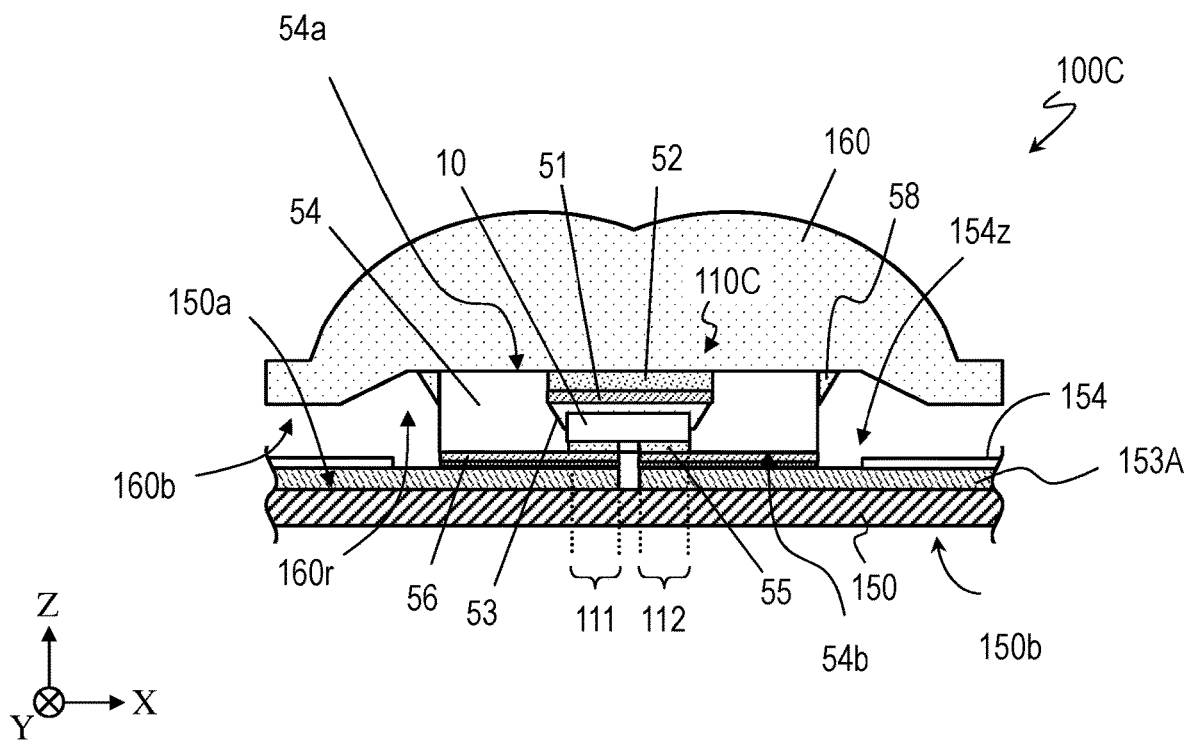
FIG. 7 is a schematic cross-sectional view showing another variation of the light-emitting device of the embodiment of the present disclosure.

FIG. 7 shows another variation of the light-emitting device of the embodiment of the present disclosure. Compared to the light-emitting device 100A, of FIG. 2, a light-emitting device 100C shown in FIG. 7 has a light-emitting element 110C instead of the light-emitting element 110A. The light-emitting element 110A and the light-emitting element 110C have a common feature that each of them has the first light-emitting cell 111 and the second light-emitting cell 112. The light-emitting element 110C includes the first light-emitting cell 111 and the second light-emitting cell 112, a light-transmissive substrate 10 disposed on the first light-emitting cell 111 and the second light-emitting cell 112, a wavelength conversion member 51 located on the light-transmissive substrate 10, and a diffusion member 52 located on the wavelength conversion member 51. The wavelength conversion member 51 is bonded to the light-transmissive substrate 10 through a bonding member 53. The wavelength conversion member 51 is bonded to the diffusion member 52.

The wavelength conversion member 51 absorbs at least a portion of light emitted from the first light-emitting cell 111 and the second light-emitting cell 112, and emits light having a wavelength different from that of light emitted by the first light-emitting cell 111 and the second light-emitting cell 112. For example, the wavelength conversion member 51 performs wavelength conversion on a portion of blue light emitted by the first light-emitting cell 111 and the second light-emitting cell 112, and thereby emits yellow light. By such a configuration, blue light transmitted through the wavelength conversion member 51 and yellow light emitted by the wavelength conversion member 51 are mixed together to provide white light.

The wavelength conversion member 51 is typically a member in which particles of a fluorescent material are dispersed in a resin. As the resin in which particles of a fluorescent material or the like are dispersed, a silicone resin, modified silicone resin, epoxy resin, modified epoxy resin, urea resin, phenolic resin, acrylic resin, urethane resin, or fluoropolymer, or a resin containing two or more such materials, can be used. A material having a refractive index different from that of the base material may be dispersed in the material of the wavelength conversion member 51 to impart a light diffusion function to the wavelength conversion member 51. For example, particles of titanium dioxide, silicon oxide, or the like may be dispersed in the base material of the wavelength conversion member 51.

As the fluorescent material, a known material can be used. Examples of the fluorescent material include fluoride fluorescent materials, such as YAG fluorescent materials and KSF fluorescent materials, nitride fluorescent materials, such as CASN, and β-SiAlON fluorescent materials. YAG fluorescent materials are examples of wavelength conversion substances that convert blue light into yellow light. KSF fluorescent materials and CASN are examples of wavelength conversion substances that convert blue light into red light. β-SiAlON fluorescent materials are examples of wavelength conversion substances that convert blue light into green light. The fluorescent material may be a quantum dot-fluorescent material.

As a material for the bonding member 53, a resin composition containing a transparent resin material as a base material can be used. A typical example of the base material for the bonding member 53 is a thermosetting resin, such as an epoxy resin or silicone resin. As the base material for the bonding member 53, a silicone resin, silicone modified resin, epoxy resin, phenolic resin, polycarbonate resin, acrylic resin, polymethyl pentene resin, or polynorbornene resin, or a material containing two or more such materials, may be used. For example, a material having a refractive index different from that of the base material for the bonding member 53 may be dispersed in the base material so that a light diffusion function is imparted to the bonding member 53.

The diffusion member 52 diffuses and transmits incident light from the wavelength conversion member 51. The diffusion member 52 is formed of, for example, a material that does not absorb much visible light, such as a polycarbonate resin, polystyrene resin, acrylic resin, or polyethylene resin. A structure for diffusing light is provided in the diffusion member 52 by providing roughness on a surface of the diffusion member 52, or dispersing a material having a different refractive index in the diffusion member 52. As the diffusion member 52, a commercially available diffusion member called a "light diffusion sheet," "diffuser film," or the like may be used.

The light-emitting element 110C preferably includes a light reflective member 54 that covers lateral surfaces of the first light-emitting cell 111, the second light-emitting cell 112, the light-transmissive substrate 10, the wavelength conversion member 51, and the diffusion member 52. In that case, the diffusion member 52 is preferably exposed on an upper surface 54a of the light reflective member 54, and electrodes 55 of the first light-emitting cell 111 and the second light-emitting cell 112 are preferably exposed on the lower surface 54b of the light reflective member 54. In addition, in that case, mounting electrodes 56 that cover the electrodes 55 are preferably on the lower surface 54b of the light reflective member 54. The lower surface 54b is larger than the electrodes 55 of the first light-emitting cell 111 and the second light-emitting cell 112, and therefore, the electrodes 56 can have a larger area. Therefore, when the light-emitting device 100C is mounted on the substrate 150, the area of contact of a bonding member such as solder with the substrate 150 can be increased, resulting in easier mounting and greater bonding strength. The light-emitting element 110C having such a structure is also called a "direct mountable chip."

The light-emitting element 110C is disposed in the recess 160r of the light-transmissive member 160. Specifically, the upper surface 54a of the light reflective member 54 is bonded to the light-transmissive member 160 by a light-transmissive bonding member 58 or the like so as to be opposite to the bottom portion of the recess 160r. The bonding member 58 may be in the shape of a fillet and may cover a portion of the lateral surface of the light-transmissive member 160. A height of the light-emitting element 110C is greater than a depth of the recess 160r. Therefore, the light-transmissive member 160 is supported by the light-emitting element 110C, so that a lower surface 160b of the light-transmissive member 160 is not in contact with, i.e., is apart from, the substrate 150, and the first reflective member 154 disposed on the substrate 150. After the light-emitting element 110C is produced, the light-emitting element 110C can be bonded to the recess 160r of the light-transmissive member 160 by a bonding member or the like to produce the light-emitting device 100C. With such a structure, for example, in the stage that the light-emitting device 100C has been produced, if the optical axes of the light-emitting element 110C and the light-transmissive member 160 are not coaxial, that light-emitting device 100C is considered out of specification and can be discarded. Therefore, when the light-emitting device 100C is mounted on the substrate 150, it is not necessary to position the light-emitting element 110C and the light-transmissive member 160 relative to each other. Therefore, compared to the case in which the light-emitting element 110C and the light-transmissive member 160 are disposed on the substrate 150, the occurrence of a defective product caused by an unacceptable positioning error can be prevented or reduced.

Figure 8:
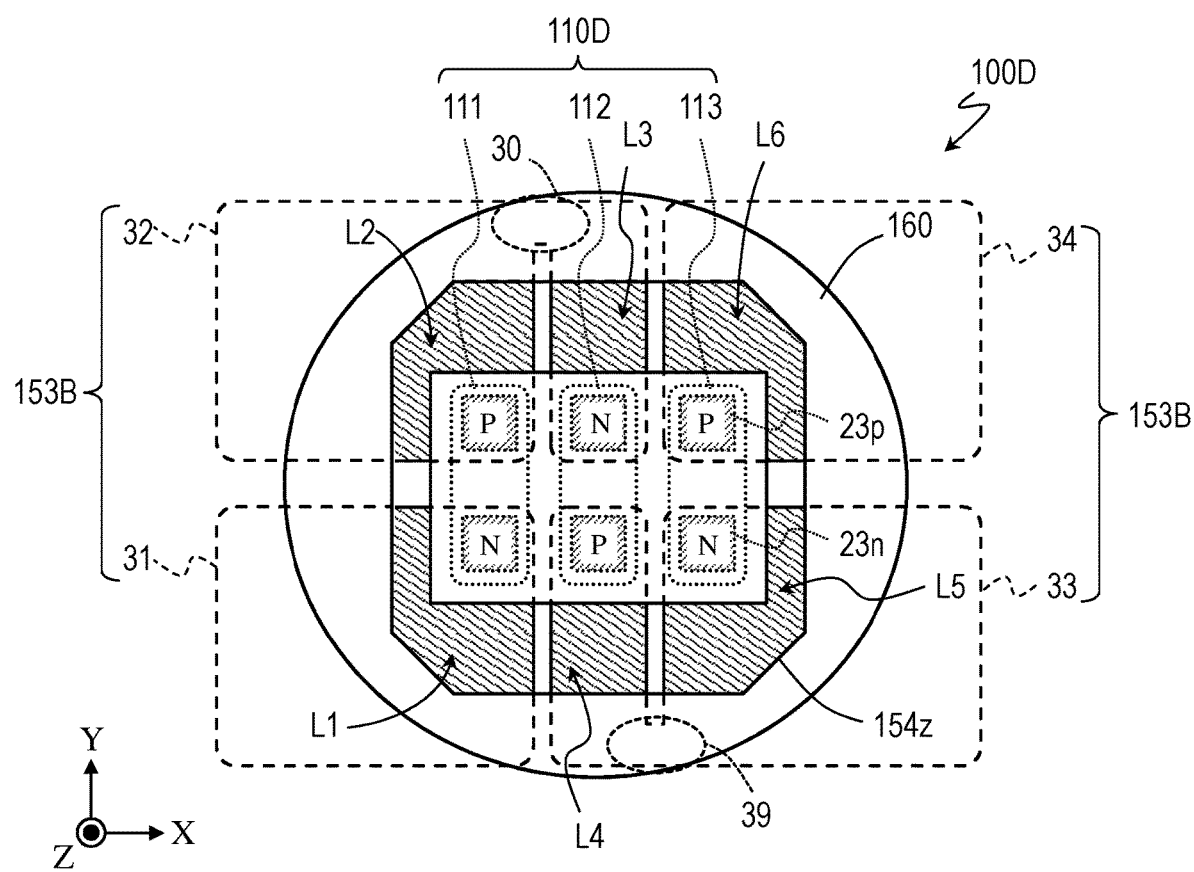
FIG. 8 is a schematic top view showing still another variation of the light-emitting device of the embodiment of the present disclosure.

FIG. 8 shows another variation of the light-emitting device of the embodiment of the present disclosure. Compared to the light-emitting device 100A of FIG. 1, a light-emitting device 100D shown in FIG. 8 has a light-emitting element 110D and an interconnection layer 153B instead of the light-emitting element 110A and the interconnection layer 153A.

The light-emitting element 110D of the light-emitting device 100D has a third light-emitting cell 113 having a third semiconductor light-emitting structure in addition to the first light-emitting cell 111 and the second light-emitting cell 112. The third light-emitting cell 113 has substantially the same structure as that of the first light-emitting cell 111. For example, as with the first light-emitting cell 111, the third light-emitting cell 113 is located on the lower surface 10b of the light-transmissive substrate 10. In addition, the third light-emitting cell 113 has an n-external electrode 23n (first electrode) electrically coupled to an n-type semiconductor layer of the third light-emitting cell 113, and a p-external electrode 23p (second electrode) electrically coupled to a p-type semiconductor layer of the third light-emitting cell 113, on the opposite side from the light-transmissive substrate 10.

In the configuration illustrated in FIG. 8, the interconnection layer 153B has a first interconnection portion 31 including a first land L1, a second interconnection portion 32 including a second land L2 and a third land L3, and a third interconnection portion 33 including a fourth land L4. Here, the third interconnection portion 33 of the interconnection layer 153B further includes a connection portion 39 and a fifth land L5. The fifth land L5 is electrically coupled to the fourth land L4 through the connection portion 39. The interconnection layer 153B further has a fourth interconnection portion 34 including a sixth land L6 as a portion thereof in addition to the first interconnection portion 31, the second interconnection portion 32, and the third interconnection portion 33. As shown in FIG. 8, a portion of the fifth land L5 of the third interconnection portion 33 and a portion of the sixth land L6 of the fourth interconnection portion 34 are exposed inside the opening 154z of the first reflective member 154, as with a portion of each of the other lands. Meanwhile, the entire connection portion 39 of the third interconnection portion 33 is located under the first reflective member 154, and therefore, is covered by the first reflective member 154.

Also in the light-emitting device 100D, a first electrode (e.g., an n-external electrode 21n) of the first light-emitting cell 111 is coupled to the first land L1 of the first interconnection portion 31 inside the opening 154z, and a second electrode (e.g., a p-external electrode 21p) of the first light-emitting cell 111 is coupled to the second land L2 of the second interconnection portion 32 inside the opening 154z, which is similar to each example described above. In addition, a first electrode (e.g., an n-external electrode 22n) of the second light-emitting cell 112 is coupled to the third land L3 of the second interconnection portion 32 inside the opening 154z, and a second electrode (e.g., a p-external electrode 22p) of the second light-emitting cell 112 is coupled to the fourth land L4 of the third interconnection portion 33 inside the opening 154z, which is also similar to each example described above.

In this example, the n-external electrode 23n of the third light-emitting cell 113 as the first electrode is coupled to a portion of the fifth land L5 of the third interconnection portion 33 that is exposed inside the opening 154z. In addition, the p-external electrode 23p of the third light-emitting cell 113 as the second electrode is coupled to a portion of the sixth land L6 of the fourth interconnection portion 34 that is exposed inside the opening 154z. As described above, the fourth land L4 and the fifth land L5 are electrically coupled to each other through the connection portion 39, so that the first light-emitting cell 111, the second light-emitting cell 112, and the third light-emitting cell 113 in the light-emitting element 110C are electrically coupled together in series through the interconnection layer 153B.

As in each example described above, in this example, the electrodes of each light-emitting cell in the light-emitting element 110C are coupled to the respective corresponding lands of the interconnection layer 153B, and a portion of each land of the interconnection layer 153B is exposed inside the opening 154z of the first reflective member 154. Therefore, for example, if a probe is selectively brought into contact with the fifth land L5 of the third interconnection portion 33 and the sixth land L6 of the fourth interconnection portion 34, electrical characteristics of the third light-emitting cell 113 of the plurality of light-emitting cells in the light-emitting element 110C can be selectively measured. In addition, as in each example described above, if the first land L1 of the first interconnection portion 31 and the second land L2 of the second interconnection portion 32 are selected, electrical characteristics of the first light-emitting cell 111 can be measured, and if the third land L3 of the second interconnection portion 32 and the fourth land L4 of the third interconnection portion 33 are selected, electrical characteristics of the second light-emitting cell 112 can be measured.

Thus, with the configuration illustrated in FIG. 8, electrical characteristics of each of the first light-emitting cell 111, the second light-emitting cell 112, and the third light-emitting cell 113 included in the light-emitting element 110D can be measured individually even with these cells electrically coupled together in series. Therefore, the first light-emitting cell 111, the second light-emitting cell 112, and the third light-emitting cell 113 can be inspected for the presence or absence of a defect such as leakage current for each light-emitting cell, i.e., the presence or absence of a defect can be detected on a cell-by-cell basis.

Figure 9:
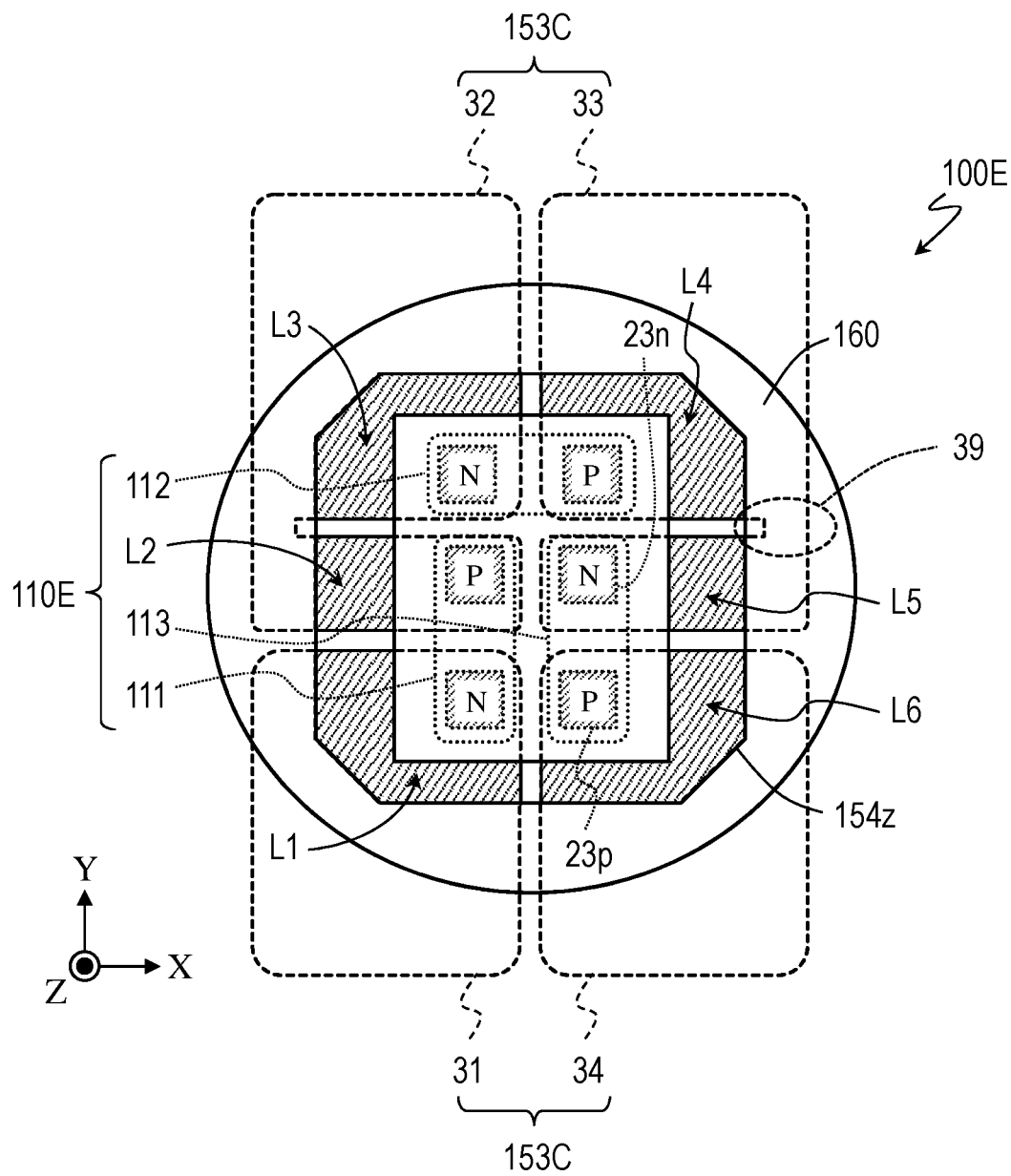
FIG. 9 is a schematic top view showing still another variation of the light-emitting device of the embodiment of the present disclosure.

The arrangement of a plurality of electrodes included in a light-emitting element and the land pattern of an interconnection layer are not limited to the examples of FIGS. 1 and 8, and can be changed as appropriate. FIG. 9 shows another variation of the light-emitting device of the embodiment of the present disclosure. A main difference between a light-emitting device 100E shown in FIG. 9 and the light-emitting device 100D of FIG. 8 is that the light-emitting device 100E has a light-emitting element 110E and an interconnection layer 153C instead of the light-emitting element 110D and the interconnection layer 153B.

As with the light-emitting element 110D of FIG. 8, the light-emitting element 110E in the light-emitting device 100E includes a first light-emitting cell 111, a second light-emitting cell 112, and a third light-emitting cell 113, each of which has a first and a second electrode. Note that the disposition of the first light-emitting cell 111, the second light-emitting cell 112, and the third light-emitting cell 113 in the light-emitting element 110E is different from that in the light-emitting element 110D of FIG. 8.

In the configuration illustrated in FIG. 9, coupling between the electrodes of the light-emitting cells and the lands of the interconnection layer is similar to that of the example described with reference to FIG. 8. Specifically, the first electrode (e.g., an n-external electrode 21n) and the second electrode (e.g., a p-external electrode 21p) of the first light-emitting cell 111 are coupled to a first land L1 of a first interconnection portion 31 and a second land L2 of a second interconnection portion 32, respectively. The first electrode (e.g., an n-external electrode 22n) and the second electrode (e.g., a p-external electrode 22p) of the second light-emitting cell 112 are coupled to a third land L3 of the second interconnection portion 32 and a fourth land L4 of a third interconnection portion 33, respectively. The first electrode (here, an n-external electrode 23n) and the second electrode (here, a p-external electrode 23p) of the third light-emitting cell 113 are coupled to a fifth land L5 of the third interconnection portion 33 and a sixth land L6 of a fourth interconnection portion 34, respectively.

Thus, an interconnection layer having a shape corresponding to the disposition of electrodes included in a plurality of light-emitting cells in a light-emitting element is provided on the substrate 150, whereby even if the number of light-emitting cells included in the light-emitting element is three or more, the presence or absence of a defect related to each light-emitting cell can be investigated with the light-emitting cells coupled together in series. Furthermore, in the examples of FIGS. 8 and 9, portions of the fourth land L4 and the fifth land L5 of the third interconnection portion 33 that are exposed in the opening 154z of the first reflective member 154 are separated from each other in space. Such a land pattern can prevent or reduce the non-uniformity of the areas inside the opening 154z of the interconnection layer 153C formed of a material that typically easily absorbs light emitted by the light-emitting element compared to the first reflective member 154. Therefore, the uniformity of light distribution in the XY plane can be improved. Note that the light-emitting element 110E and the light-emitting element 110D described above with reference to FIG. 8 may have a reflective layer 40 on an upper side thereof (e.g., the upper surface 10a of the light-transmissive substrate 10) as with the light-emitting element 110B.

Figure 10:
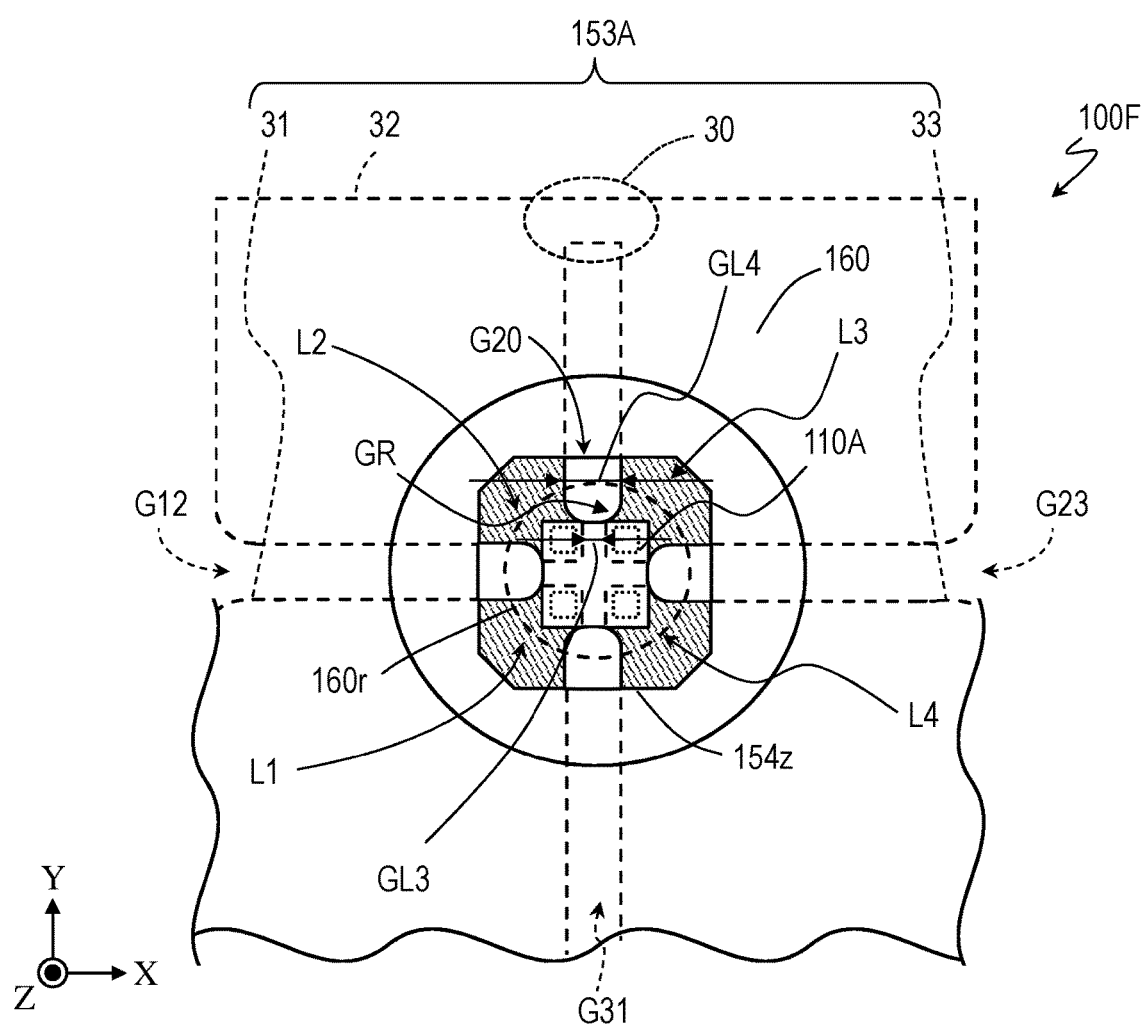
FIG. 10 is a schematic top view showing still another variation of the light-emitting device of the embodiment of the present disclosure.

FIG. 10 shows another variation of the light-emitting device of the embodiment of the present disclosure. In a light-emitting device 100F shown in FIG. 10, the gap provided between two adjacent lands of the interconnection layer 153A has a different shape compared to the light-emitting device 100A of FIG. 1, etc. Specifically, as to two adjacent ones of the first land L1, the second land L2, the third land L3, and the fourth land L4 of the interconnection layer 153A, a distance GL4 between two adjacent lands located in the opening 154z of the first reflective member 154 as viewed from above and in a region outside the light-emitting element 110A, is greater than a distance GL3 between the two adjacent lands located under the light-emitting element 110A. In the example of FIG. 10, the above structure is provided for all of the four gaps G12, G20, G23, and G31. The present disclosure is not limited to this example. The above structure may be provided in at least one gap, i.e., between at least one pair of two adjacent lands.

In the case in which the substrate 150 is formed of a white-color material, etc., and the interconnection layer 153A is formed of Cu, etc., the reflectance of the upper surface 150a of the substrate 150 is higher than that of the surfaces of the first land L1, the second land L2, the third land L3, and the fourth land L4 of the interconnection layer 153A. Therefore, the above structure of the light-emitting device 100E can provide a larger area in which the upper surface 150a of the substrate 150 is exposed in the opening 154z of the first reflective member 154. This allows light emitted from the light-emitting element 110A toward the substrate 150 to be efficiently reflected upward, resulting in an increase in the efficiency of light extraction. In addition, in the region under the light-emitting element 110A, the distance GL3 between two adjacent lands can be relatively decreased. Therefore, even in the case in which the space between electrodes of the light-emitting element 110A is small, the light-emitting element 110A can be coupled to the interconnection layer 153A without using an interposer or the like.

As shown in FIG. 10, in the gaps G12, G20, G23, and G31 between two adjacent lands, a curved portion GR having a rounded angle may be provided at or near a boundary between the region of the distance GL3 and the region of the distance GL4. As viewed from above, the curved portion GR protrudes toward the land, e.g., is convex toward the land. In the case in which the gaps G12, G20, G23, and G31 have the curved portion GR, when the light-emitting element 110A is bonded to the land, the overflow of an excess of solder, etc., from the interconnection layer 153A at or near the boundary between the region of the distance GL3 and the region of the distance GL4 can be prevented or reduced, and therefore, the solder can be smoothly spread on the interconnection layer 153A.

Figure 11:
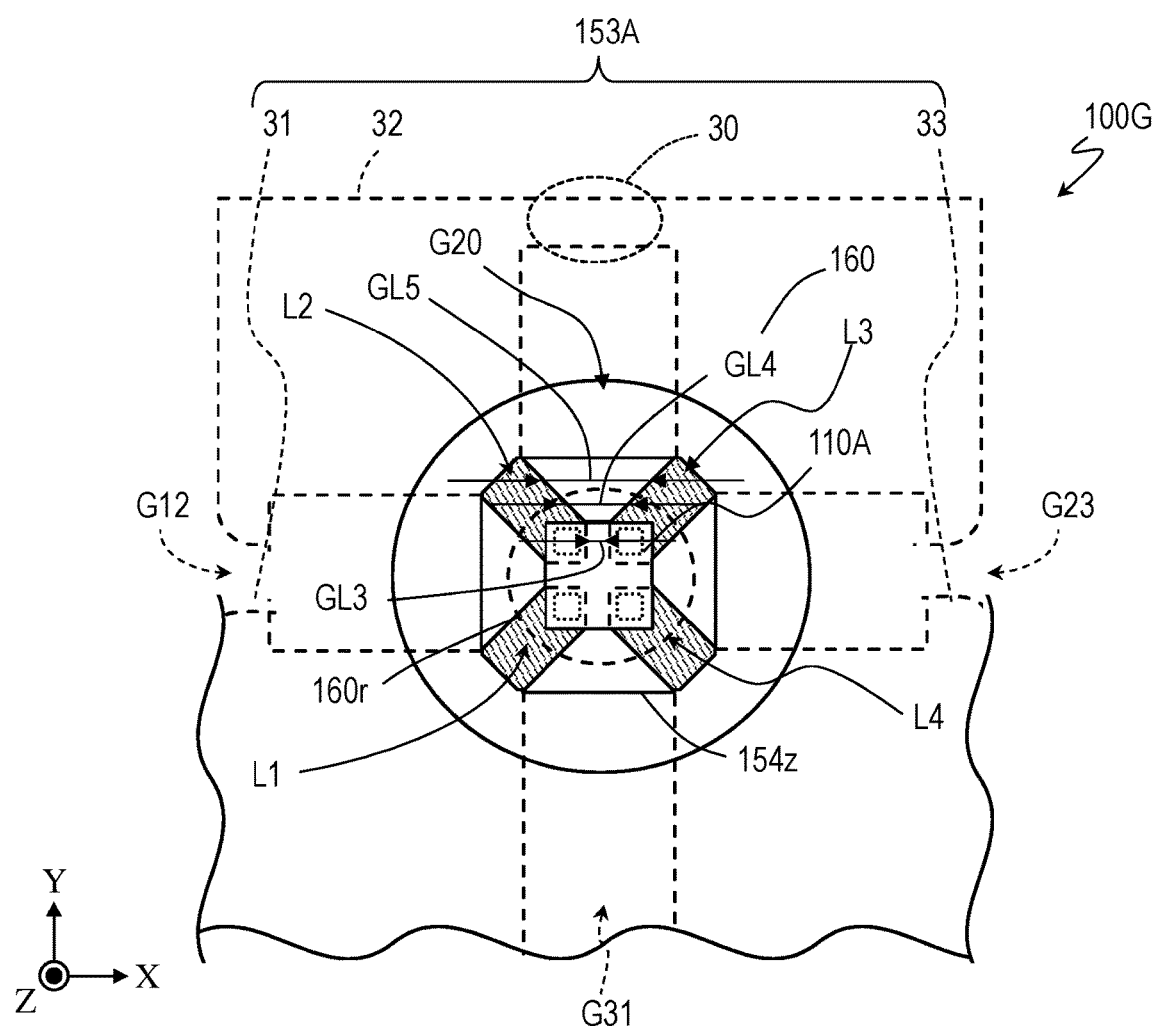
FIG. 11 is a schematic top view showing still another variation of the light-emitting device of the embodiment of the present disclosure.

FIG. 11 shows another variation of the light-emitting device of the embodiment of the present disclosure. In a light-emitting device 100G shown in FIG. 11, like the light-emitting device 100E, a gap provided between two adjacent lands of the interconnection layer 153A has a different shape compared to the light-emitting device 100A of FIG. 1, etc. In the light-emitting device 100G, a distance between two adjacent lands in the opening 154z of the first reflective member 154 as viewed from above and in a region outside the light-emitting element 110A, becomes greater stepwise or continuously from a side closer to the light-emitting element to a side further from the light-emitting element. As shown in FIG. 11, a distance GL5 is located further from the light-emitting element 110A than is a distance GL4, and the distance GL5 is greater than the distance GL4. GL4 and GL5 are each greater than a distance GL3 in a region under the light-emitting element 110A. In the example of FIG. 11, the distance between two adjacent lands in the opening 154z of the first reflective member 154 and in a region outside the light-emitting element 110A, becomes greater continuously in a direction away from the light-emitting element 110A. However, the distance between two adjacent lands may become greater stepwise in a direction away from the light-emitting element 110A.

Figure 12:
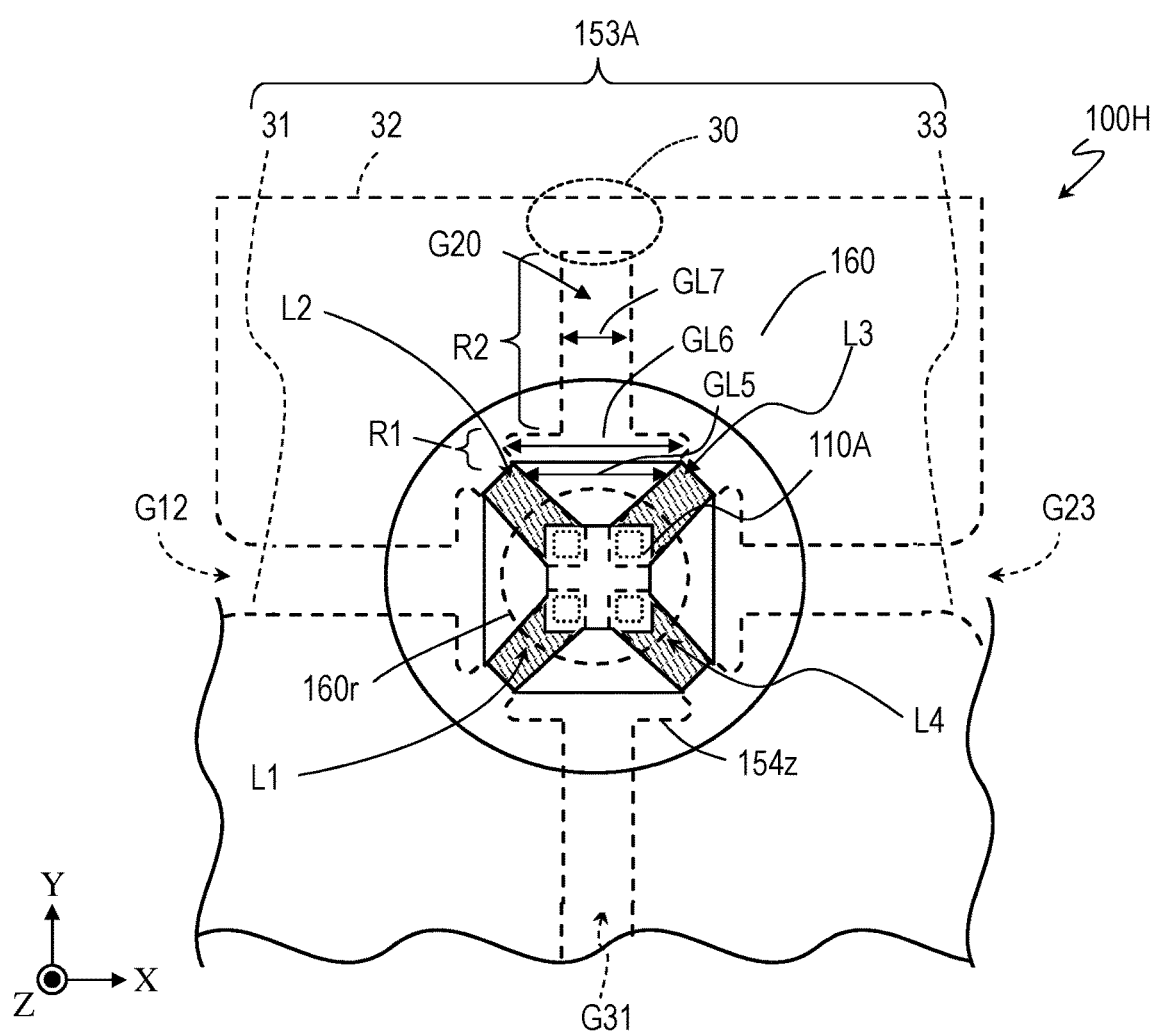
FIG. 12 is a schematic top view showing still another variation of the light-emitting device of the embodiment of the present disclosure.

FIG. 12 shows still another variation of the light-emitting device of the embodiment of the present disclosure. In a light-emitting device 100H shown in FIG. 12, like the light-emitting device 100G of FIG. 11, the gap provided between two adjacent lands of the interconnection layer 153A has a different shape compared to the light-emitting device 100A of FIG. 1, etc. In the light-emitting device 100H, as viewed from above, the distance between two lands is greater in a region R1 that is outside the opening 154z of the first reflective member 154 and is adjacent to the opening 154z than in the opening 154z of the first reflective member 154. In addition, the distance between two lands is smaller in a region R2 that is further than the region R1 from the light-emitting element 110A, than in the region R1.

As shown in FIG. 12, in the case in which the distances between two lands in the opening 154z of the first reflective member 154, the region R1, and the region R2 are represented by GL5, GL6, and GL7, respectively, GL5<GL6 and GL6>GL7 are satisfied. In the region R1, the distance GL6 between two lands may become greater stepwise or continuously in a direction away from the light-emitting element 110A. Alternatively, the distance GL6 between two lands may be invariable in the region R1, provided that GL5<GL6.

If GL5<GL6 is satisfied, the area of the exposed surface of the substrate 150 is relatively larger than the land under the first reflective member 154 located in the region R1. Therefore, if the material for the substrate 150 has a reflectance higher than that of the material for the interconnection layer 153A, the absorption of light from the light-emitting element 110A by the first reflective member 154 located in the region R1 can be prevented or reduced. In addition, if GL6>GL7 is satisfied, the land has a larger area. Therefore, heat dissipation properties of the region R2 can be improved.

Figure 13:
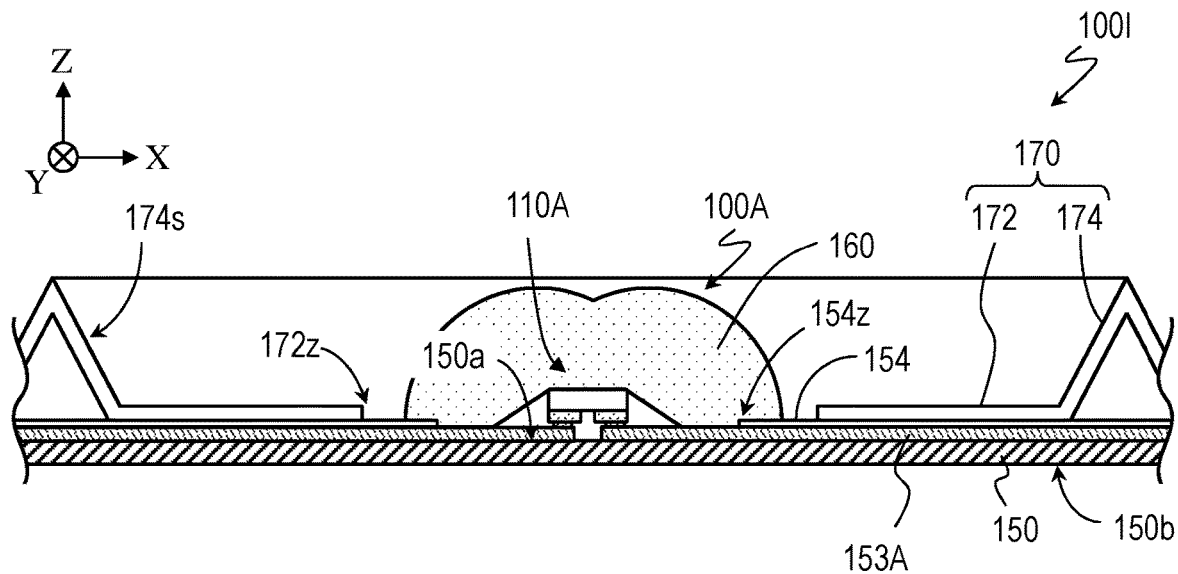
FIG. 13 is a schematic cross-sectional view showing still another variation of the light-emitting device of the embodiment of the present disclosure.

FIG. 13 shows still another variation of the light-emitting device of the embodiment of the present disclosure. A light-emitting device 100I shown in FIG. 13 has a second reflective member 170 including a plurality of sloped surfaces 174s in addition to the light-emitting element 110A and the substrate 150. In other words, roughly speaking, the light-emitting device 100I is configured so that the second reflective member 170 is added to the light-emitting device 100A described above with reference to FIG. 1, etc.

As schematically shown in FIG. 13, the second reflective member 170 is located over the interconnection layer 153A and the first reflective member 154. Here, the second reflective member 170 has a layer-shaped base portion 172 that covers the first reflective member 154, and a wall portion 174 that extends upward from the base portion 172 in a direction away from the substrate 150, these portions being disposed on the upper surface 150a of the substrate 150. In the configuration illustrated in FIG. 13, the wall portion 174, which is a structure in the shape of a triangular prism extending in the Y or X direction in the figure, includes the sloped surface 174s that is sloped with respect to the base portion 172. The base portion 172 of the second reflective member 170 has an opening 172z. The light-emitting element 110A, and a light-transmissive member 160 that covers the light-emitting element 110A, are located inside the opening 172z as viewed from above. Note that the wall portion 174 may be either a hollow structure or a solid structure.

The second reflective member 170 is typically formed of a light-transmissive resin, such as a polycarbonate (PC), PET, polymethyl methacrylate (PMMA), polypropylene (PP), or polystyrene (PS). A light diffusion function may be imparted to the second reflective member 170 by dispersing, in a base material such as the resin, a material having a refractive index different from that of the base material. The second reflective member 170 can be formed by performing molding with a mold, such as injection molding, extrusion molding, compression molding, vacuum molding, pressure molding, or press molding, stereolithography, or the like. For example, by applying vacuum molding to a light-transmissive sheet formed of PET or the like, the light-transmissive sheet can be shaped so that the base portion 172, and the wall portion 174 having the plurality of sloped surfaces 174s, are integrally formed. The light-transmissive sheet has a thickness of, for example, 100-500 µm.

The sloped surfaces 174s of the wall portion 174, which are, for example, disposed so as to surround the periphery of the light-emitting element 110A as viewed from above, serves as a reflective surface that reflects upward light from the light-emitting element 110A. By disposing the second reflective member 170 over the substrate 150, uniform light can be obtained in a larger region, and therefore, for example, a surface-emission light source having a high luminance and reduced luminance non-uniformity can be provided.

Figure 14:
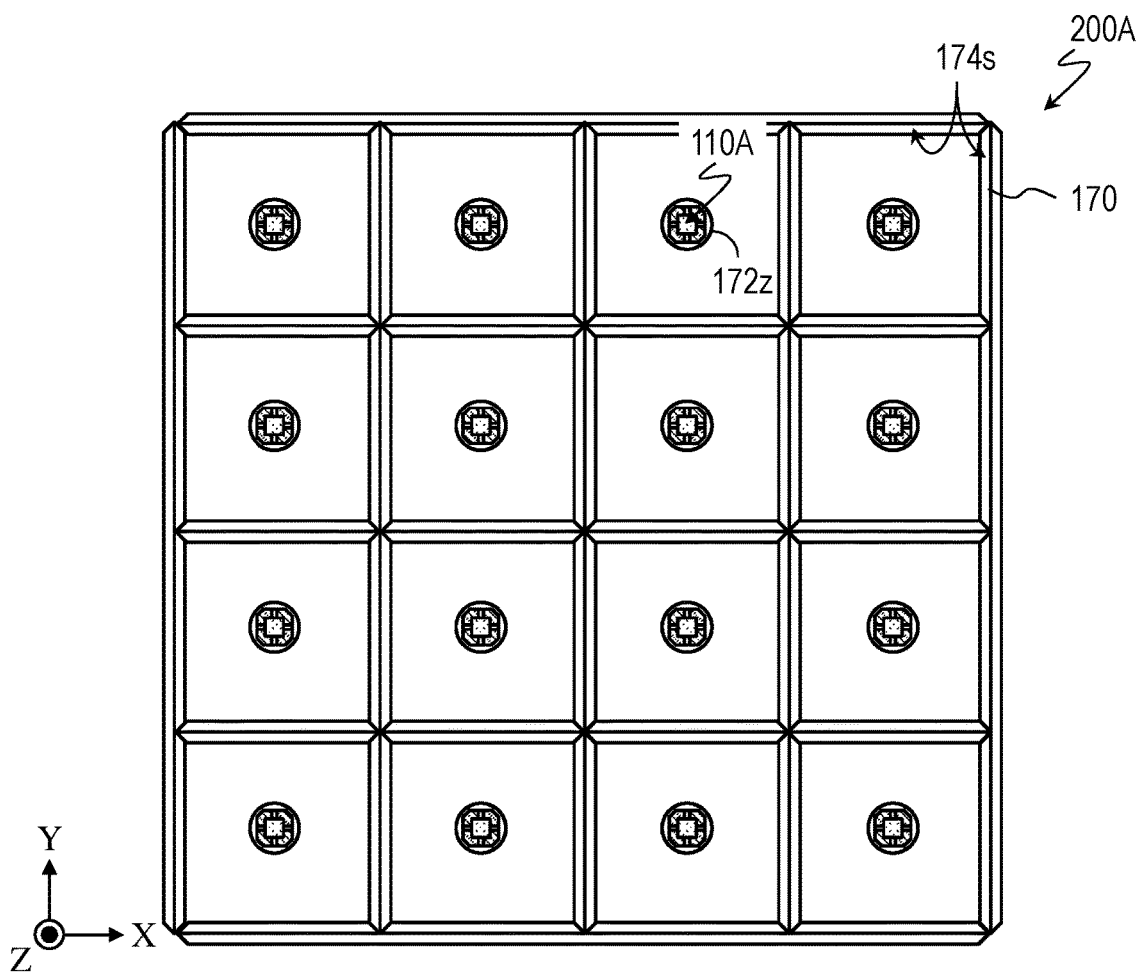
FIG. 14 is a schematic top view showing an example integrated light-emitting device having a two-dimensional array of the light-emitting devices of FIG. 13.

FIG. 14 shows an example integrated light-emitting device having a two-dimensional array of the light-emitting devices of FIG. 13. An integrated light-emitting device 200A shown in FIG. 14 includes an array of 16 units each having a structure similar to that shown in FIG. 13. These units are disposed in a matrix of four rows and four columns in the XY plane of the figure. As shown in FIG. 14, the plurality of sloped surfaces 174s each extend in the X or Y direction in the figure, and each light-emitting element 110A is surrounded by four of the plurality of sloped surfaces 174s.

The integrated light-emitting device 200A, which is a surface-emission light source including a plurality of light emission regions arranged in a matrix of four rows and four columns, is useful as, for example, a backlight for a liquid crystal display device. As shown in FIGS. 13 and 14, each light-emitting element 110A is surrounded by a plurality of sloped surfaces 174s, and therefore, luminance non-uniformity can be prevented or reduced in each light emission region, and even in groups of light emission regions. Note that, of course, a similar effect can be obtained even in the case in which the second reflective member 170 is combined with the light-emitting element 110B, 110C, or 110D instead of the light-emitting element 110A.

Figure 15:
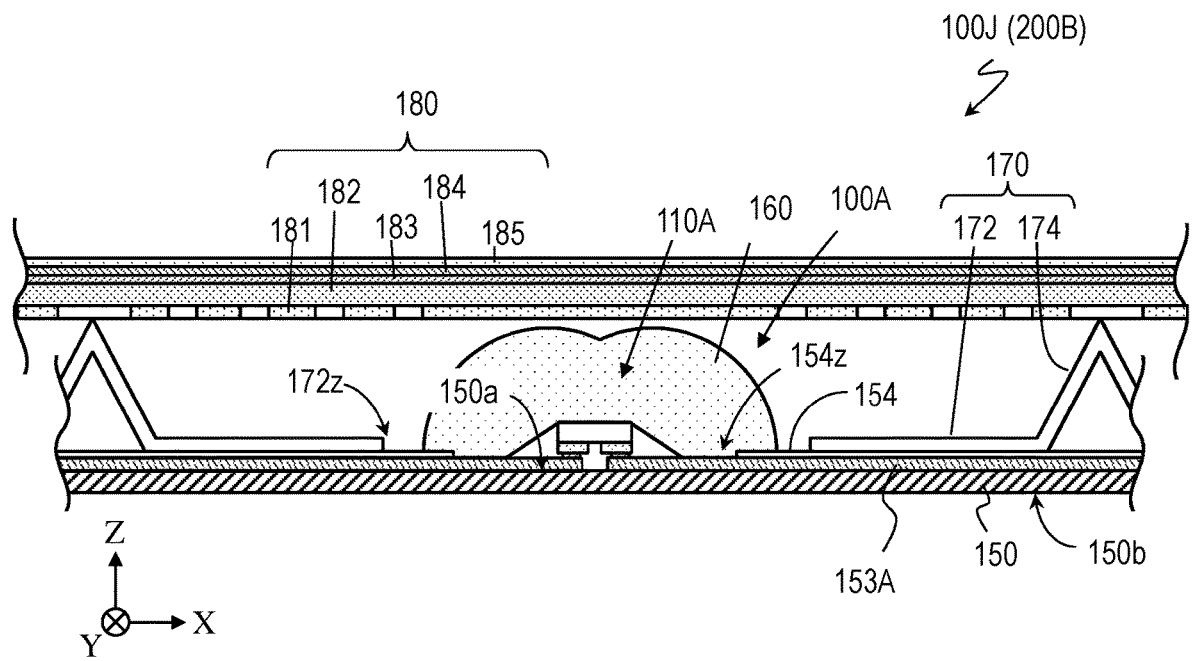
FIG. 15 is a schematic cross-sectional view showing another example integrated light-emitting device according to an embodiment of the present disclosure.

Another example integrated light-emitting device is shown in FIG. 15. Specifically, FIG. 15 is a cross-sectional view showing one light-emitting device 100J in an integrated light-emitting device 200B. The integrated light-emitting device 200B includes a two-dimensional array of light-emitting devices 100J. The light-emitting device 100J is different from the light-emitting device 100I of FIG. 13 in that the light-emitting device 100J has an optical multilayer structure 180. The optical multilayer structure 180 includes, for example, a one-way mirror 181, a diffuser 182, and at least one prism sheet 183. In the example of FIG. 15, the optical multilayer structure 180 further includes a prism sheet 184 and a polarization sheet 185. The optical multilayer structure 180 is preferably located on the side of the substrate 150 on which the light-emitting element 110A is supported, while the prism sheet 183 is preferably located on the light emission side. The diffuser 182 is preferably located between the one-way mirror 181 and the prism sheet 183.

Figure 16:
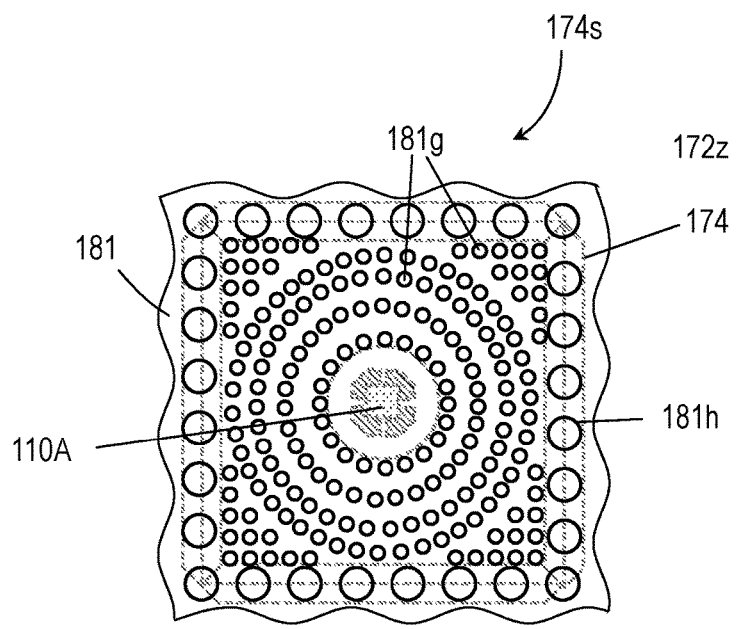
FIG. 16 is a schematic top view showing a portion of a one-way mirror used in the integrated light-emitting device of FIG. 15.

The one-way mirror 181 transmits a portion of incident light from the direction of the substrate 150 and reflects a portion of the light back to the substrate 150. FIG. 16 is a schematic plan view of the one-way mirror 181. The one-way mirror 181 includes a plurality of holes 181h and 181g on the main surfaces thereof. In this embodiment, the holes 181h and 181g are a physical through hole that penetrates from one main surface to the other main surface. In the regions of the holes 181h and 181g, the one-way mirror 181 transmits light, substantially without reflection. Therefore, by adjusting the sizes, numbers, and positions of holes 181h and 181g, the one-way mirror 181 can have two-dimensional distributions of light transmission characteristics and light reflection characteristics so that incident light from the direction of the substrate 150 is emitted to the diffuser 182 with the luminance non-uniformity and color non-uniformity thereof prevented or reduced. In the case in which the one-way mirror 181 includes a light-transmissive substrate and an dielectric multilayer film supported by the substrate, similar optical characteristics may be obtained without providing holes in the substrate or providing a dielectric multilayer film in the regions of the holes 181h and 181g.

In the example of FIG. 16, the holes 181h, which are larger than the holes 181g, are disposed over the wall portions 174 surrounding the periphery of the light-emitting element 110A. The holes 181g are disposed in concentric circles around the light-emitting element 110A as the center, and at the corners of a quadrilateral surrounded by the wall portions 174. The disposition of the holes 181h having a larger diameter over the wall portions 174 allows leakage of light to the sections of adjacent light-emitting elements at the boundaries of the wall portions 174, and therefore, the boundaries of the sections defined by the wall portions 174 are made less visible.

The diffuser 182 diffuses light transmitted through the one-way mirror 181 in various traveling directions, resulting in a reduction in luminance non-uniformity and color non-uniformity. The prism sheets 183 and 184 refract incident light to change the traveling direction of the light so that the light is emitted in a front direction. The prism sheets 183 and 184 are disposed so that the prisms thereof are orthogonal to each other, and therefore, light is emitted in the front direction more accurately, whereby luminance in the front direction is increased. For example, the polarization sheet 185 reflects the S wave of incident light and transmits the P wave of incident light, and thereby, emits light having a uniform polarized direction, so that the luminance of a specific polarized wave surface of light emitted from the light-emitting device 100J is increased. In particular, this is effective in the case in which the integrated light-emitting device 200B is used as a backlight for a liquid crystal panel.

Figure 17:
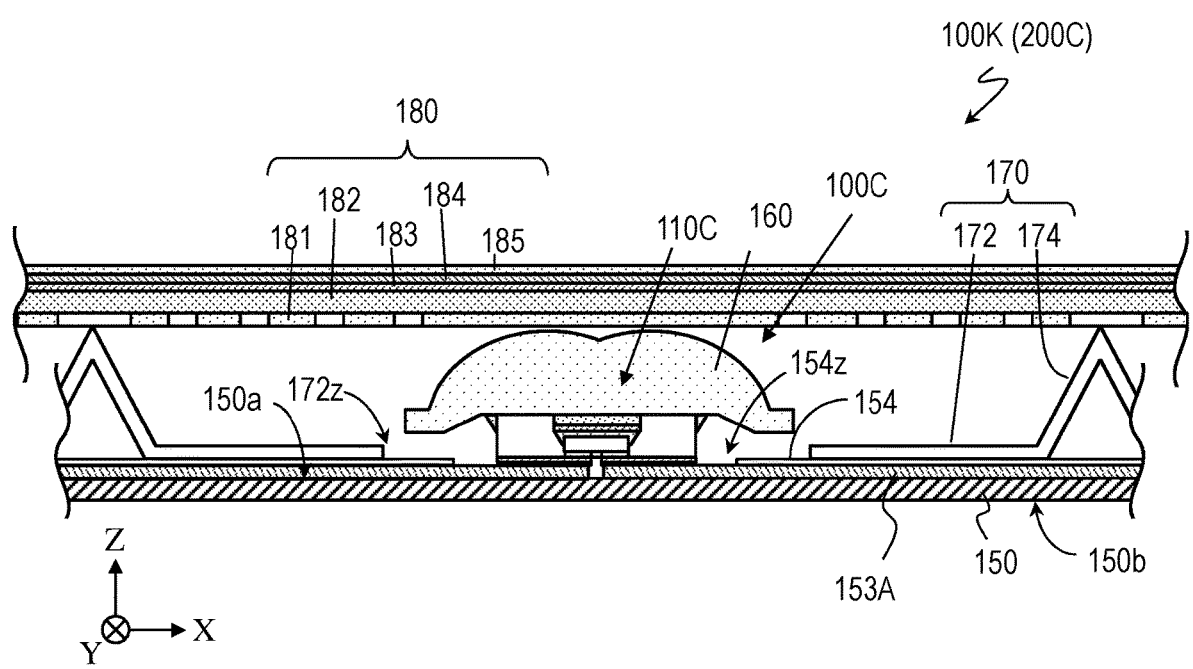
FIG. 17 is a schematic cross-sectional view showing still another example integrated light-emitting device according to an embodiment of the present disclosure.

Still another example integrated light-emitting device is shown in FIG. 17. Specifically, FIG. 17 is a cross-sectional view showing one of light-emitting devices 100K included in an integrated light-emitting device 200C. The integrated light-emitting device 200C includes a two-dimensional array of light-emitting devices 100K. The light-emitting device 100K is different from the light-emitting device 100J of FIG. 15 in that the light-emitting device 100K includes the light-emitting device 100C. In the integrated light-emitting device 200C, the light-emitting device 100K includes the light-transmissive member 160, and the light-emitting device 100C including the light-emitting element 110C. Therefore, when the light-emitting device 100C is mounted on the substrate 150, it is not necessary to position the light-emitting element 110C and the light-transmissive member 160 with respect to each other. Therefore, compared to the case in which the light-emitting element 110C and the light-transmissive member 160 are disposed on the substrate 150, the occurrence of a defective product caused by an unacceptable positioning error can be prevented or reduced. In particular, the integrated light-emitting device 200C includes a plurality of light-emitting devices 100K, and therefore, a manufacturing yield thereof can be effectively improved.

The integrated light-emitting devices 200A and 200B each include a plurality of light-emitting elements 110A, disposed on the substrate 150. Therefore, each light-emitting element 110A can be inspected for leakage current or the like with the light-emitting element 110A mounted on the substrate 150. This is helpful in verifying the performance of the manufactured integrated light-emitting devices 200A and 200B, repairing the manufactured integrated light-emitting devices 200A and 200B, etc., and thereby improving the efficiency of production of the integrated light-emitting devices 200A and 200B.

The embodiments of the present disclosure are useful for various types of light sources for lighting, in-vehicle light sources, light sources for displays, etc. In particular, the embodiments of the present disclosure are advantageously applicable to backlight units for liquid-crystal display devices. A light-emitting device and integrated light-emitting device according to an embodiment of the present disclosure can be suitably used in a backlight for the display device of a mobile device, which heavily requires a reduction in thickness, a surface-emission device on which local dimming control can be performed, etc.

While exemplary embodiments of the present invention have been described above, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light-emitting device comprising:
   a light-emitting element having an upper surface, and comprising a plurality of semiconductor light-emitting structures electrically separated from each other; and
   a substrate supporting the light-emitting element;
   wherein:
   the plurality of semiconductor light-emitting structures include a first semiconductor light-emitting structure and a second semiconductor light-emitting structure;
   the substrate comprises:
      an interconnection layer comprising:
         a first interconnection portion comprising a first land,
         a second interconnection portion comprising a second land and a third land, and
         a third interconnection portion comprising a fourth land, and
      a first reflective member covering a portion of the interconnection layer and having an opening;
   the light-emitting element is located inside the opening of the first reflective member as viewed from above;
   a portion of the first land, a portion of the second land, a portion of the third land, and a portion of the fourth land are exposed in the opening of the first reflective member;
   the portion of the first land and the portion of the second land are electrically connected to the first semiconductor light-emitting structure;
   the portion of the third land and the portion of the fourth land are electrically connected to the second semiconductor light-emitting structure;
   a first distance between two adjacent ones of the first, second, third, and fourth lands in the opening of the first reflective member and outside the light-emitting element as viewed from above becomes greater stepwise or continuously from a side closer to the light-emitting element to a side further from the light-emitting element; and
   a second distance between said two adjacent ones of the first, second, third, and fourth lands in a first region that is outside the opening of the first reflective member and is adjacent to the opening of the first reflective member is greater than the first distance; and
   a third distance between said two adjacent ones of the first, second, third, and fourth lands in a second region that is further from the light-emitting element than the first region is smaller than the second distance.

2. The light-emitting device according to claim 1, wherein:
   a portion of the second interconnection portion of the interconnection layer that electrically couples the second land to the third land is entirely covered by the first reflective member; and
   said portion of the second land is spatially separated from said portion of the third land.

3. The light-emitting device according to claim 1, wherein:
   said portions of the first, second, third, and fourth lands have a 4-fold rotational symmetrical arrangement about a center of the light-emitting element.

4. The light-emitting device according to claim 2, wherein:
   said portions of the first, second, third, and fourth lands have a 4-fold rotational symmetrical arrangement about a center of the light-emitting element.

5. The light-emitting device according to claim 1, wherein each of the first semiconductor light-emitting structure and the second semiconductor light-emitting structure comprises a first electrode and a second electrode having different polarities at a side opposite the upper surface of the light-emitting element.

6. The light-emitting device according to claim 5, wherein:
   said portion of the first land is coupled to the first electrode of the first semiconductor light-emitting structure;
   said portion of the second land is coupled to the second electrode of the first semiconductor light-emitting structure;
   said portion of the third land is coupled to the first electrode of the second semiconductor light-emitting structure; and
   said portion of the fourth land is coupled to the second electrode of the second semiconductor light-emitting structure.

7. The light-emitting device according to claim 1, wherein:
   the light-emitting element comprises a reflective layer at an upper surface side of the light-emitting element.

8. The light-emitting device according to claim 2, wherein:
   the light-emitting element comprises a reflective layer at an upper surface side of the light-emitting element.

9. The light-emitting device according to claim 3, wherein:
   the light-emitting element comprises a reflective layer at an upper surface side of the light-emitting element.

10. The light-emitting device according to claim 1, further comprising:
    a light-transmissive member covering the light-emitting element and a portion of the first reflective member on the substrate.

11. The light-emitting device according to claim 10, wherein:
    an outer periphery of the light-transmissive member is located outward of the opening of the first reflective member as viewed from above.

12. The light-emitting device according to claim 10, wherein:
    the light-transmissive member has a recess on a side thereof closer to the substrate.

13. The light-emitting device according to claim 12, wherein:
    the light-emitting element is locased in the recess of the light-transmissive member.

14. The light-emitting device according to claim 13, wherein:
    the recess of the light-transmissive member is smaller than the opening of the first reflective member as viewed from above.

15. The light-emitting device according to claim 10, wherein:
    the light-transmissive member has a peak portion in a shape of a ring as viewed from above.

16. The light-emitting device according to claim 10, wherein:
    a height of the light-transmissive member is smaller than a width of the light-transmissive member in a cross section passing through a center of the light-transmissive member as viewed from above and perpendicular to the substrate.

17. The light-emitting device according to claim 1, further comprising:
- a second reflective member located over the interconnection layer and the first reflective member, the second reflective member having a plurality of sloped surfaces surrounding the light-emitting element as viewed from above.

18. The light-emitting device according to claim 7, further comprising:
- a second reflective member located over the interconnection layer and the first reflective member, the second reflective member having a plurality of sloped surfaces surrounding the light-emitting element as viewed from above.

19. The light-emitting device according to claim 10, further comprising:
- a second reflective member located over the interconnection layer and the first reflective member, the second reflective member having a plurality of sloped surfaces surrounding the light-emitting element as viewed from above.

20. The light-emitting device according to claim 1, wherein:
- a distance between two adjacent ones of the first, second, third, and fourth lands of the interconnection layer is greater in a region located in the opening of the first reflective member and outside the light-emitting element as viewed from above than in a region under the light-emitting element.

* * * * *